United States Patent
Berggren et al.

(10) Patent No.: US 9,664,751 B1
(45) Date of Patent: May 30, 2017

(54) 2D ARRAYS OF DIAMOND SHAPED CELLS HAVING MULTIPLE JOSEPHSON JUNCTIONS

(71) Applicants: Susan Anne Elizabeth Berggren, San Diego, CA (US); Patrick Longhini, San Diego, CA (US); Visarath In, San Diego, CA (US); Georgy Prokopenko, Sleepy Hollow, NY (US); Antonio Palacios, San Diego, CA (US); Oleg A. Mukhanov, Putnam Valley, NY (US)

(72) Inventors: Susan Anne Elizabeth Berggren, San Diego, CA (US); Patrick Longhini, San Diego, CA (US); Visarath In, San Diego, CA (US); Georgy Prokopenko, Sleepy Hollow, NY (US); Antonio Palacios, San Diego, CA (US); Oleg A. Mukhanov, Putnam Valley, NY (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 107 days.

(21) Appl. No.: 14/029,859

(22) Filed: Sep. 18, 2013

Related U.S. Application Data

(63) Continuation-in-part of application No. 13/686,994, filed on Nov. 28, 2012.

(51) Int. Cl.
G01R 33/02 (2006.01)
G01R 33/035 (2006.01)
G01R 3/00 (2006.01)

(52) U.S. Cl.
CPC ........... *G01R 33/0354* (2013.01); *G01R 3/00* (2013.01)

(58) Field of Classification Search
CPC ............ G01R 33/0354; G01R 33/0358; G01R 33/326; G01R 33/035; Y10S 505/846
(Continued)

(56) References Cited

U.S. PATENT DOCUMENTS 4,613,817 A * 9/1986 Hoenig .......................... 324/248
4,638,257 A * 1/1987 McDonald .................. 330/61 R
(Continued)

OTHER PUBLICATIONS

Patrick Longhini et al., Voltage Response of Non-Uniform Arrays of Bi-Superconductive Quantum Interference Devices, J. Appl. Phys. 111, 093920 (2012); doi: 10.1063/1.4712039.
(Continued)

*Primary Examiner* — Giovanni Astacio-Oquendo
(74) *Attorney, Agent, or Firm* — SSC Pacific Patent Office; Arthur K. Samora; Kyle Eppele

(57) ABSTRACT

A two-dimensional SQIF array and methods for manufacture can include at least two bi-SQUIDs that share an inductance. The bi-SQUIDs can be combined to establish a diamond-shaped cell. A plurality of the diamond shaped cells can be packed tightly together so that each cell shares at least three cell junctions with adjacent cells to establish the SQIF array. Because of the close proximity of the cells, the effect that the mutual inductances each cell has on adjacent cells can be accounted for, as well as the SQIF array boundary conditions along the array edges. To do this, a matrix of differential equations can be solved to provide for the recommended inductance of each bi-SQUID in the SQIF array. Each bi-SQUID can be manufactured with the recommended inductance to result in a SQIF having an increased strength of anti-peak response, but without sacrificing the linearity of the response.

8 Claims, 10 Drawing Sheets

(58) Field of Classification Search
USPC ......... 324/248, 225, 200, 244; 505/846, 845
See application file for complete search history.

(56) References Cited

U.S. PATENT DOCUMENTS

| | | | | |
|---|---|---|---|---|
| 4,982,157 | A * | 1/1991 | Seifert | 324/248 |
| 5,053,834 | A * | 10/1991 | Simmonds | G01R 33/0358 |
| | | | | 257/31 |
| 5,198,815 | A * | 3/1993 | Przybysz | H03M 3/438 |
| | | | | 341/133 |
| 5,465,049 | A * | 11/1995 | Matsuura | G01R 33/0358 |
| | | | | 324/248 |
| 5,532,485 | A * | 7/1996 | Bluzer et al. | 250/336.2 |
| 5,574,290 | A * | 11/1996 | You | H01L 39/225 |
| | | | | 257/31 |
| 5,600,242 | A * | 2/1997 | Hubbell | 324/248 |
| 5,646,526 | A * | 7/1997 | Takeda et al. | 324/248 |
| 5,677,043 | A * | 10/1997 | Hultman | B41M 5/42 |
| | | | | 428/206 |
| 5,844,407 | A * | 12/1998 | Hubbell | G01R 33/0354 |
| | | | | 324/248 |
| 5,936,458 | A * | 8/1999 | Rylov | 327/528 |
| 6,285,186 | B1 * | 9/2001 | Morooka | G01R 33/0354 |
| | | | | 324/248 |
| 6,627,916 | B2 * | 9/2003 | Amin et al. | 257/31 |
| 6,690,162 | B1 * | 2/2004 | Schopohl et al. | 324/248 |
| 7,129,869 | B2 * | 10/2006 | Furuta et al. | 341/133 |
| 8,179,133 | B1 * | 5/2012 | Kornev | G01R 33/0354 |
| | | | | 324/225 |
| 8,571,614 | B1 * | 10/2013 | Mukhanov et al. | 505/170 |
| 2004/0232912 | A1 * | 11/2004 | Tsukamoto | G01R 33/0358 |
| | | | | 324/248 |
| 2006/0061368 | A1 * | 3/2006 | Furse | G01R 31/11 |
| | | | | 324/519 |
| 2007/0241747 | A1 * | 10/2007 | Morley | G01R 33/0354 |
| | | | | 324/248 |
| 2011/0047201 | A1 * | 2/2011 | Macready | B82Y 10/00 |
| | | | | 708/446 |
| 2011/0065585 | A1 * | 3/2011 | Lanting | G01R 33/0354 |
| | | | | 505/162 |
| 2011/0285393 | A1 * | 11/2011 | Zakosarenko et al. | 324/248 |

OTHER PUBLICATIONS

G.V. Prokopenko et al., DC and RF Measurements of Serial Bi-SQUID Arrays, IEEE Trans. Appl. Supercond., vol. 23 (Submitted).

S. Berggren et al., Development of 2-D Bi-SQUID Arrays With High Linearity, IEEE Trans. Appl. Supercond., vol. 232, No. 3 (Jun. 2013).

Berggren, Susan Anne Elizabeth, "Development of 2D bi-SQUID Arrays With High Linearity", Presentation, 1EB-01 ASC'12, Portland, OR, Oct. 8, 2012.

Longhini et al., Unpublished U.S. Appl. No. 13/686,994, filed Nov. 28, 2012, entitled "Linear Voltage Response of Non-Uniform Arrays of Bi-SQUIDs".

* cited by examiner

2D ARRAYS OF DIAMOND SHAPED CELLS HAVING MULTIPLE JOSEPHSON JUNCTIONS

CROSS-REFERENCE TO RELATED APPLICATIONS

This application is a continuation-in-part of U.S. application Ser. No. 13/686,994, filed Nov. 28, 2012, and entitled "Linear Voltage Response of Non-Uniform Arrays of Bi-SQUIDs". The '994 application is hereby incorporated by reference herein in its entirety

FEDERALLY-SPONSORED RESEARCH AND DEVELOPMENT

This invention (Navy Case No. 102297) is assigned to the United States Government and is available for licensing for commercial purposes. Licensing and technical inquires may be directed to the Office of Research and Technical Applications, Space and Naval Warfare Systems Center, Pacific, Code 72120, San Diego, Calif. 92152; voice (619) 553-5118; email ssc pac T2@navy.mil.

FIELD OF THE INVENTION

The present invention pertains generally to mechanisms and methods for improving signal detection and amplification. More specifically, the present invention pertains to Superconducting Quantum Interference Filters (SQIFs). The invention is particularly, but not exclusively, useful as a SQIF having multiple Superconductive Quantum Interference Devices (SQUIDs), which can be arranged in a two-dimensional array so that adjacent bi-SQUIDs share inductances.

BACKGROUND OF THE INVENTION

The SQUID is one of the most sensitive magnetic field devices in the prior art, and it can be used for wide range of applications, including biology, medicine, geology, systems for semiconductor circuit diagnostics, security, magnetic resonance imaging (MRI) and even cosmology research. In recent years, arrays of coupled oscillators have been considered as a general mechanism for improving signal detection and amplification. Theoretical and experimental studies can be interpreted to show that arrays of SQUIDs can yield comparable improvements in signal output relative to background noise, over those of a single SQUID device.

A peculiar configuration that has gained considerable attention among the physics and engineering community is that of multi-loop arrays of Josephson Junctions (JJs) with non-uniformly distributed loop areas. Typically, each loop contains two JJs, i.e., a standard DC-SQUID, but the loop size varies from loop to loop. These types of unconventional geometric structures of JJs are known to exhibit a magnetic flux dependent voltage response $V(\phi_e)$, where $\phi_e$ denotes an external magnetic flux normalized by the quantum flux, that has a pronounced single peak with a large voltage swing at zero magnetic field. The potential high dynamic range and linearity of the "anti-peak" voltage response render the array an ideal detector of absolute strength of external magnetic fields. These arrays are also commonly known as Superconducting Quantum Interference Filters (SQIFs).

Improving the linearity of SQIFs is critical for developing advanced technologies, such as low noise amplifiers (LNA's) that can further increase link margins and affect an entire communication system. SQIFs can also be used in unmanned aerial vehicles (UAVs), where size, weight and power are limited, and as "electrically small" antennas to provide acceptable gain for the antenna. SQIFs can also be used in land mine detection applications. But for all of these applications, it is desired to improve the linear response of the SQIF device.

The quest to increase the linearity of SQUID and SQIF arrays was boosted by the introduction of the bi-SQUID, which has three 3 JJ's. A non-linear inductance of the additional third JJ can provide a desired linearizing effect for the orverall SQIF. These bi-SQUIDs are now being used in uniform and non-uniform (SQIF) arrays in place of conventional dc SQUIDs with a goal of achieving higher linearity. However, most of the design efforts to date that use SQUIDs and/or bi-SQUIDs are directed at the optimization of one-dimensional (1D) serial or parallel arrays and their combinations. This is due to the higher complexity analysis and modeling required for 2D arrays to account for mutual coupling that occurs between neighboring cells and complex current distribution in arrays. What is desired is a two-dimesnsional array of bi-SQUIDs.

In view of the above, it is an object of the present invention to provide a two-dimensional (2D) SQIF array having a tightly coupled 2D network of bi-SQUID cells, in which junctions and inductances are shared between adjacent bi-SQUID cells. Another object of the present invention is to provide a two-dimensional (2D) SQIF array having diamond shaped, dual bi-SQUID cells. Still another object of the present invention is to provide a 2D SQIF that maximizes the number of bi-SQUID cells which can be placed with a given SQIF array area. Yet another object of the present invention is to maximize the voltage response and dynamic range of a SQIF by manipulating the critical current, inductive coupling between loops, number of loops, bias current, and distribution of loop areas of the array cells of diamond bi-SQUIDs. Still another object of the present invention is to provide a 2D SQIF array with increased high dynamic range and linearity of the "anti-peak" response, for use in multiple applications such as magnetic field detectors, magnetic antennas and wide-band low-noise amplifiers. Another object of the present invention is to provide a SQIF and methods for manufacture that can be easily tailored in a cost-effective manner to result in a SQIF having bi-SQUID array cells that has been optimized according to the user's needs.

SUMMARY OF THE INVENTION

A two-dimensional SQIF array and methods for manufacture according to several embodiments of the present invention can include at least two bi-SQUIDs that share an inductance. The two bi-SQUIDs can be combined to establish a cell that is diamond shaped when viewed in top plan. A plurality of the diamond shaped cells can be packed tightly together to establish the SQIF array. With this configuration, each cell shares at least three cell junctions with adjacent cells.

Because of the close proximity of the cells, the effect that the mutual inductances each cell has on adjacent cells can be accounted for. Additionally, the boundary conditions along the edges can be determined. To do this, a matrix of sixty-six 66 differential equations can be solved to provide for the recommended inductance of each bi-SQUID in the 2D SQIF array. Each bi-SQUID can be manufactured with the recommended inductance to result in a SQIF having an increased strength of anti-peak response, but without sacrificing the linearity of the response.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

A. Prior Art.

Figure 1:
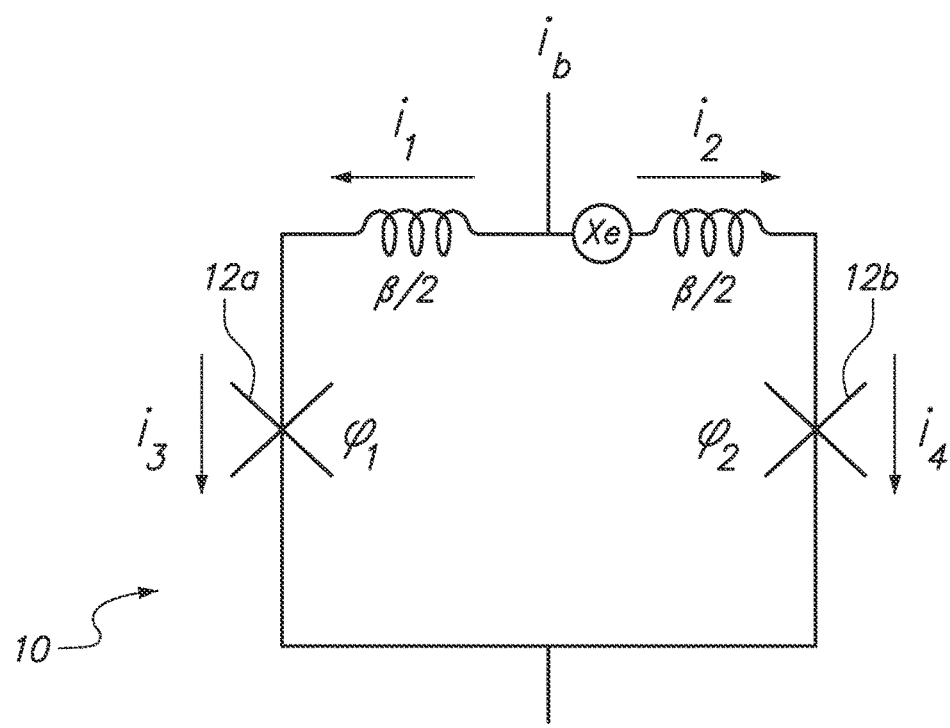
FIG. 1 is a schematic diagram of a direct current Superconductive Quantum Interference Devices (DC-SQUID) as known in the prior art.
Figure 2:
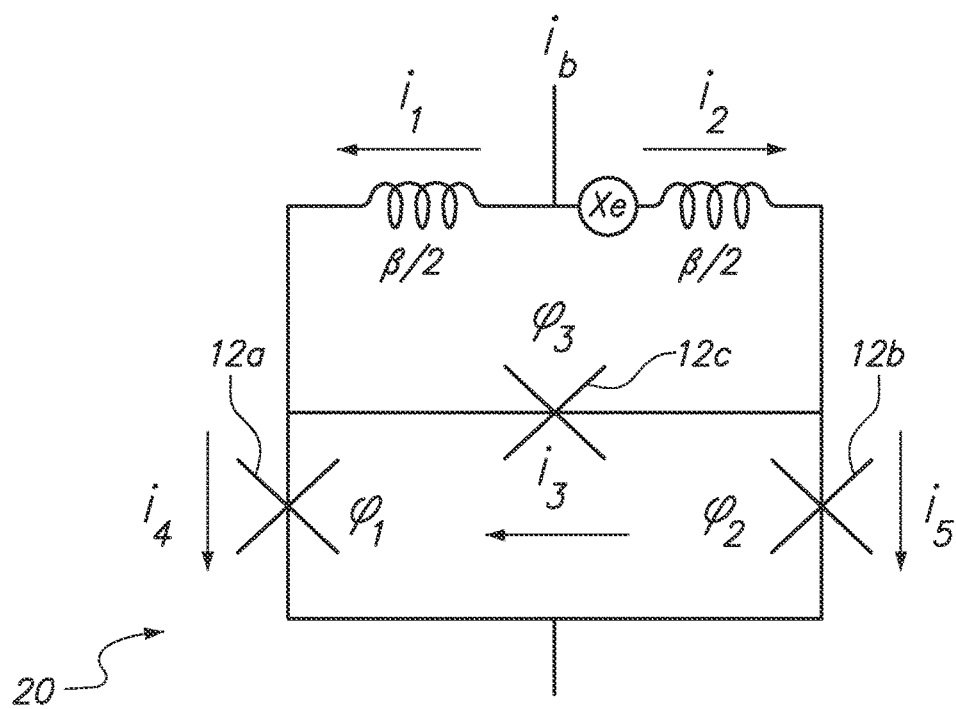
FIG. 2 is a schematic diagram of a prior art bi-SQUID.

In brief overview, and referring initially to FIGS. 1 and 2, a DC SQUID 10 and DC bi-SQUID 20 are shown. FIG. 1 is a schematic diagram of a single DC SQUID 10. DC SQUID 10 can have two Josephson Junctions (JJ's) 12a, 12b arranged in parallel, connected with superconducting material, as represented by the schematic diagram in FIG. 1. A DC bi-SQUID 20, which is a SQUID with an additional Josephson junction 12c bisecting the superconducting loop, was introduced as an alternative to traditional SQUIDs. DC bi-SQUIDs have shown superior linearity in the average voltage response anti-peak feature. In FIG. 2, ($i_b$, $i_1$, $i_2$, $i_3$, $i_4$, $i_5$) can be the normalized currents through bi-SQUID 20, ($\phi_1$, $\phi_2$, $\phi_3$) can represent the phases across the Josephson junctions 12a-12c, $\beta/2$ is the parameter related to the inductance values and $x_e$ (point 14) can represent the point in the equations where the external fields (not shown) are included.

The equations for modeling the JJ's for the DC SQUID of FIG. 1 can be derived using Kirchhoff's current law, which is the principle of conservation of electric charge and implies that at any junction in an electrical circuit the sum of currents flowing into that node is equal to the sum of currents flowing out of that node, along with a resistively shunted junction (RSJ) model of the over-damped JJ. The JJ's can be assumed to be symmetric such that for the normalized critical currents $i_{c1}=i_{c2}=1.0$. The system of equations that models a single DC SQUID dynamics is:

$$\dot{\varphi}_1 = J - \frac{1}{\beta}(\varphi_1 - \varphi_2 - \varphi_e) - \sin\varphi_1 \qquad (1)$$

$$\dot{\varphi}_2 = J + \frac{1}{\beta}(\varphi_1 - \varphi_2 - \varphi_e) - \sin\varphi_2,$$

where $\phi_1$ and $\phi_2$ are the phases across each of the Josephson junctions and the dots denote the time differentiation with normalized time $$\tau = \omega_c t = \frac{2eI_0 R_N}{\hbar} t.$$

The parameter $\omega_c$ in $\tau=2\pi/(\Phi_0)(I_0)(R_N)$. The parameter $R_N$ in $\tau$ is the normal state resistance of the Josephson junctions and $I_0$ is the critical current of the Josephson junctions.

$$\beta = 2\pi \frac{LI_0}{\Phi_0}$$

is the nonlinear parameter related to the SQUID inductance $$L, J = \frac{I_b}{2I_0},$$

where $I_b$ is bias current, and $\phi_e = 2\pi a x_e$, where $x_e$ is the normalized external magnetic field and $$a = \beta. \quad \Phi_0 \equiv \frac{h}{2e} \approx 2.07 \times 10^{-15}$$

tesla meter squared is the flux quantum, where h is Plank's constant and 2e is the charge on the Cooper pair.

The phase equations for the single DC bi-SQUID schematic in FIG. 2 can be derived in a similar way to those of the single DC SQUID. In this case there is a third junction $J_3$ that is related to the first and second junctions through the phases: $\phi_1 + \phi_3 = \phi_2$. Using this relationship, all the terms that include $\phi_3$ can be replaced with $\phi_2 - \phi_1$, thereby reducing the number of phase equations needed to model the system from three to two. The governing equations for a single bi-SQUID are $$\dot{\varphi}_1 = \frac{i_b}{2} - \frac{1}{3\beta}(\varphi_1 - \varphi_2 - \varphi_e) + \frac{1}{3}i_{c3}\sin(\varphi_2 - \varphi_1) - \frac{2}{3}\sin\varphi_1 - \frac{1}{3}\sin\varphi_2 \qquad (2)$$

$$\dot{\varphi}_2 = \frac{i_b}{2} + \frac{1}{3\beta}(\varphi_1 - \varphi_2 - \varphi_e) - \frac{1}{3}i_{c3}\sin(\varphi_2 - \varphi_1) - \frac{1}{3}\sin\varphi_1 - \frac{2}{3}\sin\varphi_2,$$

where $$i_{c3} = \frac{I_{c3}}{I_0}$$

is the normalized critical current on the third junction and all other parameters are defined as the single DC SQUID.

Figure 3:
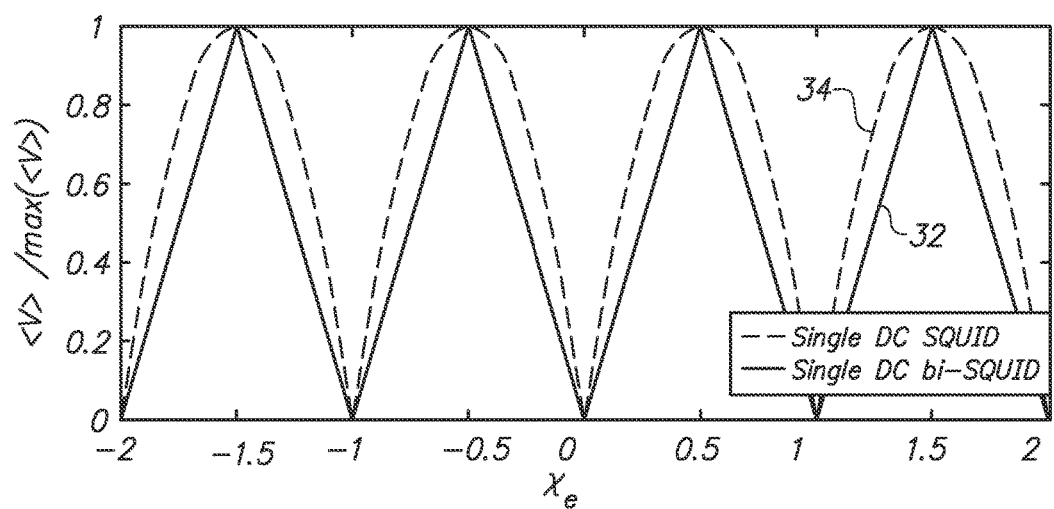
FIG. 3 is a graphical representation of the voltage response of the DC-SQUID and bi-SQUID of FIGS. 1 and 2, as a function of magnetic field strength.

The voltage response of both the single DC SQUID 10 of FIG. 1 and the DC bi-SQUID 20 of FIG. 2 can be simulated by integrating the systems of equations that model the system dynamics, Eq (1) and Eq (2) respectively. After the phases $\phi_1$ and $\phi_2$ have been determined the derivatives $\dot{\phi}_1$ and $\dot{\phi}_2$ are evaluated and the time-dependent voltage $$V(t) = \frac{\dot{\varphi}_1 + \dot{\varphi}_2}{2}$$

is calculated. The average voltage, <V>, of a SQUID (or bi-SQUID) at a point in $x_e$ is the mean value of the voltage over time. FIG. 3 illustrates the results of this process. FIG. 3 is an average voltage response of a single DC SQUID compared with that of a single DC bi-SQUID. The average voltage response of the bi-SQUID (line 32), with the proper selection of parameters, has a more linear average voltage response than the conventional DC SQUIDs (line 34 in FIG. 3). The simulations were performed with J=1.0, β=1.0 and $i_{c3}$=1.0. The higher linearity of the average voltage response of the bi-SQUID can increase the overall utility of the device that incorporates the bi-SQUID as a linear amplifier, provided the bi-SQUIDs are incorporated to optimize the overal linearity of the device.

The structure and cooperation of structure of the SQUID and bi-SQUID, and the design and performance of one-dimensional SQIF's using such components are discused in more detail in the aforementioned '994 application, which has been incorporated in its entirety into this specification.

B. Dual Bi-SQUID Cell.

Figure 4:
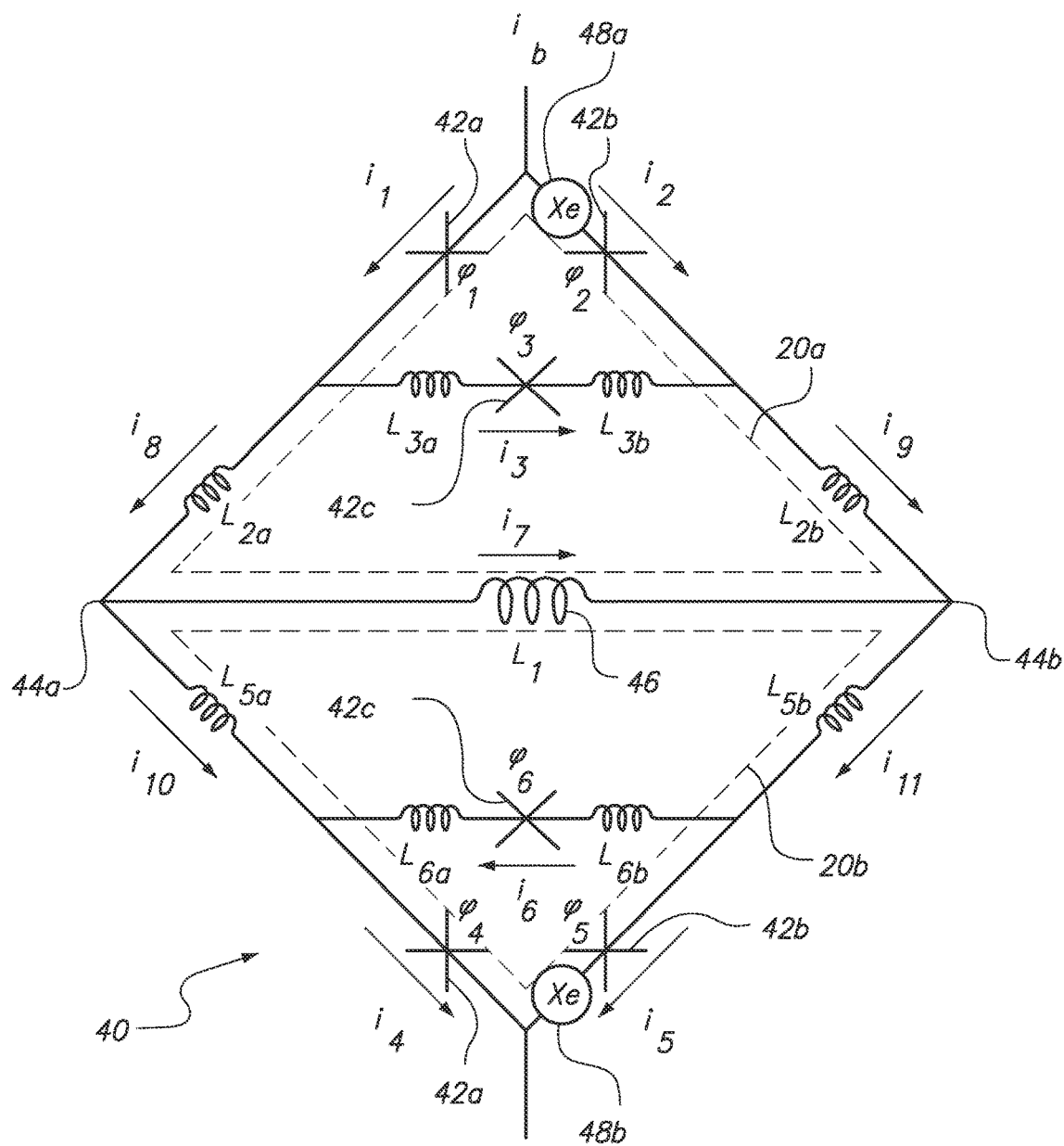
FIG. 4 is a schematic diagram of a single cell dual bi-SQUID of the 2D Array of the present invention according to several embodiments.

Referring now to FIG. 4, FIG. 4 depicts a circuit of a dual bi-SQUID cell structure 40 of the present invention according to several embodiments. As shown in FIG. 4, cell 40 can further include at least two bi-SQUIDs 20a, 20b (indicated by the dotted lines in FIG. 4), which can be merged so that the bi-SQUIDs share at least one two bi-SQUID junctions 44a, 44b and at least one inductance 46. With this configuration, cell 40 can present a diamond shaped appearance when viewed in top plan. It should be appreciated, however, that other geometric views (such as hexagonal, for example) are possible, provided the equations discussed below are modified and derived using Kirchoff's law to account for the conservation of currents in such alternative embodiments.

In FIG. 4, $i_b$ can be taken to represent an input base current into cell 40, $(i_1, \ldots, i_{11})$ can represent the normalized currents through the various bi-SQUID junctions 44, and $(\phi_1 \ldots \phi_6)$ can represent the phases across the JJ's 42 in cell 40 through bi-SQUIDs 20, $(L_1, L_{2a}, \ldots, L_{6a}, L_{2b}, \ldots, L_{6b})$ represent the parameters related to the inductances and $x_e$ (points 48a, 48b) can represent the points in the equations where the external fields are included. Using these representations, six governing equations are needed to simulate the average voltage response for this device, which contains 12 currents, 6 Josephson junctions and 9 inductors.

Kirchhoff's current law results in the following relations for the currents and phases in the diamond-shaped dual bi-SQUID $$\begin{aligned}
i_b &= i_1 + i_2 & i_1 &= i_3 + i_8 \\
i_2 + i_3 &= i_9 & i_8 &= i_7 + i_{10} \\
i_9 + i_7 &= i_{11} & i_{10} + i_6 &= i_4 \\
i_{11} &= i_6 + i_5 & i_4 + i_5 &= i_b \\
i_1 &= \sin\varphi_1 + \dot{\varphi}_1 & i_2 &= \sin\varphi_2 + \dot{\varphi}_2 \\
i_4 &= \sin\varphi_4 + \dot{\varphi}_4 & i_5 &= \sin\varphi_5 + \dot{\varphi}_5 \\
i_3 &= i_{c3}\sin\varphi_3 + \dot{\varphi}_3 & i_6 &= i_{c6}\sin\varphi_6 + \dot{\varphi}_6,
\end{aligned} \quad (3)$$

where $i_{c3}=I_{c3}/I_0$ is the normalized critical current of the third junction, $i_{c6}=I_{c6}/I_0$ is the normalized critical current of the sixth junction, $I_{c1}=I_{c2}=I_{c4}=I_{c5}=I_0$, and $\phi_i$ are the phases across of the Josephson junctions for i=1, . . . ,6. The dots on the equations in this specficiation denote time differentiation with respect to normalized time τ=$ω_c$t, where $ω_c$ and t remain defined as above. The resistively-shunted junction (RSJ) model provides a current-phase relation around the top half of the diamond of dual bi-SQUID cell 40 (bi-SQUID 20a)

$$\phi_1 + L_1 i_7 + L_{2a} i_8 = 2\pi x_e a_1 + \phi_2 + L_{2b} i_9,$$

where $\phi_e = 2\pi a_1 x_e$, where $x_e$ is the normalized external magnetic flux and $a_1 = L_1 + L_{2a} + L_{2b}$. Combining $i_7 = i_8 - i_{10}$ and $i_7 = i_{11} - i_9$ such that $$i_7 = \frac{i_8 - i_{10}}{2} + \frac{i_{11} - i_9}{2},$$

and then substituting the current relations for $i_7$, $i_{10}$, $i_9$, and $i_8$ yields $$\left(\frac{L_1}{2} + L_{2a}\right)i_1 - \frac{L_1}{2}i_4 + \frac{L_1}{2}i_5 + L_1 i_6 = \quad (4)$$
$$\varphi_2 - \varphi_1 + \left(\frac{L_1}{2} + L_{2b}\right)i_2 + 2\pi x_e a_1 + (L_1 + L_{2a} + L_{2b})i_3.$$

In order to get the first of the six equations that is needed to describe the dynamics of the diamond shape, the bias current relation $i_2 = i_b - i_1$ and Josephson junction relations from Eq. (3) are substituted into Eq. (4) to become $$L_{12}(\dot{\varphi}_1 - \dot{\varphi}_3) + \frac{L_1}{2}(2\dot{\varphi}_6 + \dot{\varphi}_5 - \dot{\varphi}_4) = \left(\frac{L_1}{2} + L_{2b}\right)i_b + \varphi_2 - \varphi_1 + \quad (5)$$
$$2\pi x_e a_1 + L_{12}(i_{c3}\sin\varphi_3 - \sin\varphi_1) + \frac{L_1}{2}(\sin\varphi_4 - \sin\varphi_5 - 2i_{c6}\sin\varphi_6),$$

where $L_{12} = L_1 + L_{2a} + L_{2b}$.

To solve for the second of the six equations that governs the dynamics of the single diamond the current relations for the bias current $i_1 = i_b - i_2$ and Josephson junctions from Eq. (3) are substituted into Eq. (4) to give $$\frac{L_1}{2}(2\dot{\varphi}_6 + \dot{\varphi}_5 - \dot{\varphi}_4) - L_{12}(\dot{\varphi}_2 + \dot{\varphi}_3) = -\left(\frac{L_1}{2} + L_{2a}\right)i_b + \varphi_2 - \varphi_1 + \quad (6)$$
$$2\pi x_e a_1 + L_{12}(i_{c3}\sin\varphi_3 + \sin\varphi_2) + \frac{L_1}{2}(\sin\varphi_4 - \sin\varphi_5 - 2i_{c6}\sin\varphi_6),$$

where $L_{12} = L_1 + L_{2a} + L_{2b}$.

The RSJ model also provides a current-phase relation around the upper loop in the single diamond according to the equation $\phi_1+\phi_3+L_3i_3=\phi_2$, where $L_3=L_{3a}+L_{3b}$. Substituting the Josephson junction relations from Eq. (3) and reorganizing yields the third of the six equations for the dynamics of the single diamond.

$$L_3\dot{\phi}_3=\varphi_2-\varphi_1-\varphi_3-L_3i_{c3}\sin\phi_3. \tag{7}$$

A current-phase relation around the bottom half (bi-SQUID $20b$) of the single diamond cell 40 can be determined to be $\phi_4+L_{5a}i_{10}=2\pi x_e a_2+\phi_5+L_{5b}i_{11}+L_1i_7$, where $\phi_e=2\pi a_2 x_e$ and $a_2=L_1+L_{5a}+L_{5b}$. Substituting the current relations $$i_7=\frac{i_8-i_{10}}{2}+\frac{i_{11}-i_9}{2},$$

$i_{10}=i_4-i_6$, $i_{11}=i_5+i_6$, $i_9=i_2+i_3$ and $i_8=i_1-i_3$ from Eq. (3) and then reorganizing gives $$\left(L_{5a}+\frac{L_1}{2}\right)i_4-(L_1+L_{5a}+L_{5b})i_6= \tag{8}$$
$$\varphi_5-\varphi_4+2\pi x_e a_2+\left(L_{5b}+\frac{L_1}{2}\right)i_5+\frac{L_1}{2}i_1-\frac{L_1}{2}i_2-L_1i_3.$$

Substituting the current relation for the bias current $i_5=i_b-i_4$ from Eq. (3) into Eq. (8) and then substituting the Josephson junction relations from Eq. (3) and reorganizing leads to the fourth governing equation $$L_{15}(\dot{\varphi}_4-\dot{\varphi}_6)+\frac{L_1}{2}(2\dot{\varphi}_3+\dot{\varphi}_2-\dot{\varphi}_1)=\left(L_{5b}+\frac{L_1}{2}\right)i_b+\varphi_5-\varphi_4+ \tag{9}$$
$$2\pi x_e a_2+L_{15}(i_{c6}\sin\varphi_6-\sin\varphi_4)+\frac{L_1}{2}(\sin\varphi_1-\sin\varphi_2-2i_{c3}\sin\varphi_3),$$

where $L_{15}=L_1+L_{5a}+L_{5b}$.

To solve for the fifth of the six equations for the dynamics of the single diamond shape the current relations for the bias current $i_4=i_b-i_5$ and Josephson junctions from Eq. (3) is substituted into Eq. (8) to become $$\frac{L_1}{2}(2\dot{\varphi}_3+\dot{\varphi}_2-\dot{\varphi}_1)-L_{15}(\dot{\varphi}_5+\dot{\varphi}_6)=-\left(L_{5b}+\frac{L_1}{2}\right)i_b+\varphi_5-\varphi_4+ \tag{10}$$
$$2\pi x_e a_2+L_{15}(i_{c6}\sin\varphi_6+\sin\varphi_5)+\frac{L_1}{2}(\sin\varphi_1-\sin\varphi_2-2i_{c3}\sin\varphi_3),$$

where $L_{15}=L_1+L_{5a}+L_{5b}$.

For the sixth governing equations a current-phase relation can be found for the lower loop in the diamond $$\phi_4+\phi_6+L_6i_6=\phi_5,$$

where $L_6=L_{6a}+L_{6b}$. Substituting the Josephson junction relations from Eq. (3) into the relation and reorganizing yields $$L_6\dot{\phi}_6=\varphi_5-\varphi_4-\varphi_6-L_6i_{c3}\sin\phi_3. \tag{11}$$

The equations from Eq. (5)-(7) and Eq. (9)-(11) can be combined to obtain the full system of equations that governs the phase dynamics of the diamond-shaped bi-SQUID:

$$L_{12}(\dot{\varphi}_1-\dot{\varphi}_3)+\frac{L_1}{2}(2\dot{\varphi}_6+\dot{\varphi}_5-\dot{\varphi}_4)=\left(\frac{L_1}{2}+L_{2b}\right)i_b+\varphi_2-\varphi_1+ \tag{12}$$
$$2\pi x_e a_1+L_{12}(i_{c3}\sin\varphi_3-\sin\varphi_1)+\frac{L_1}{2}(\sin\varphi_4-\sin\varphi_5-2i_{c6}\sin\varphi_6);$$

$$\frac{L_1}{2}(2\dot{\varphi}_6+\dot{\varphi}_5-\dot{\varphi}_4)-L_{12}(\dot{\varphi}_2+\dot{\varphi}_3)=-\left(\frac{L_1}{2}+L_{2a}\right)i_b+\varphi_2-\varphi_1+$$
$$2\pi x_e a_1+L_{12}(i_{c3}\sin\varphi_3+\sin\varphi_2)+\frac{L_1}{2}(\sin\varphi_4-\sin\varphi_5-2i_{c6}\sin\varphi_6);$$

$$L_3\dot{\varphi}_3=\varphi_2-\varphi_1-\varphi_3-L_3i_{c3}\sin\varphi_3;$$

$$L_{15}(\dot{\varphi}_4-\dot{\varphi}_6)+\frac{L_1}{2}(2\dot{\varphi}_3+\dot{\varphi}_2-\dot{\varphi}_1)=\left(L_{5b}+\frac{L_1}{2}\right)i_b+\varphi_5-\varphi_4+$$
$$2\pi x_e a_2+L_{15}(i_{c6}\sin\varphi_6-\sin\varphi_4)+\frac{L_1}{2}(\sin\varphi_1-\sin\varphi_2-2i_{c3}\sin\varphi_3);$$

$$\frac{L_1}{2}(2\dot{\varphi}_3+\dot{\varphi}_2-\dot{\varphi}_1)-L_{15}(\dot{\varphi}_5+\dot{\varphi}_6)=$$
$$-\left(L_{5b}+\frac{L_1}{2}\right)i_b+\varphi_5-\varphi_4+2\pi x_e a_2+$$
$$L_{15}(i_{c6}\sin\varphi_6+\sin\varphi_5)+\frac{L_1}{2}(\sin\varphi_1-\sin\varphi_2-2i_{c3}\sin\varphi_3);\text{ and,}$$

$$L_6\dot{\varphi}_6=\varphi_5-\varphi_4-\varphi_6-L_6i_{c3}\sin\varphi_3,$$

where $L_{12}=L_1+L_{2a}+L_{2b}$, $L_3=L_{3a}+L_{3b}$, $L_{15}=L_1+L_{5a}+L_{5b}$, $L_6=L_{6a}+L_{6b}$ and $\phi_i$ are the phases on each of the Josephson junctions, i=1, . . . ,6. The normalized critical current on the third junction is $$i_{c3}=\frac{I_{c3}}{I_0},$$

the normalized critical current of the sixth junction is $$i_{c6}=\frac{I_{c6}}{I_0},$$

$I_{c1}=I_{c2}=I_{c4}=I_{c5}=I_0$, $x_e$ is the normalized external magnetic flux, $a_1=L_1+L_{2a}+L_{2b}$ and $a_2=L_1+L_{5a}+L_{5b}$.

Figure 5:
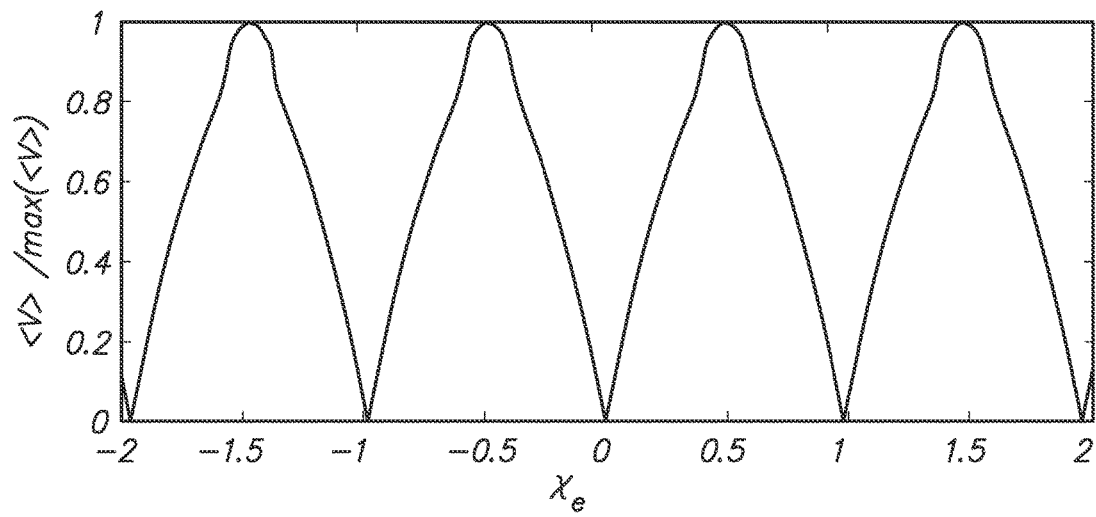
FIG. 5 is a graphical representation of the voltage response of the single cell dual bi-SQUID of FIG. 4 as a function of magnetic field strength.

Once the equations above are solved for inductances, values can be substituted there for the inductance and the average voltage response for the diamond shaped bi-SQUID cell 40 of the present invention according to several embodiments is shown in FIG. 5. The response can be plotted for J=1.001, $L_1$=0.54, $L_{2a}=L_{2b}=L_{5a}=L_{5b}$=0.24, $L_{3a}=L_{3b}=L_{6a}=L_{6b}$=0.3, and $i_{c3}$=0.5 These values are all normalized values, without units. As shown in FIG. 5, this average voltage response retains its linearity, with proper choice of parameters, such as varying the inductances instead of the loop sizes the triangle-shaped bi-SQUIDs 20 in the cell. The actual size of the triangle could also be varied.

Figure 6:
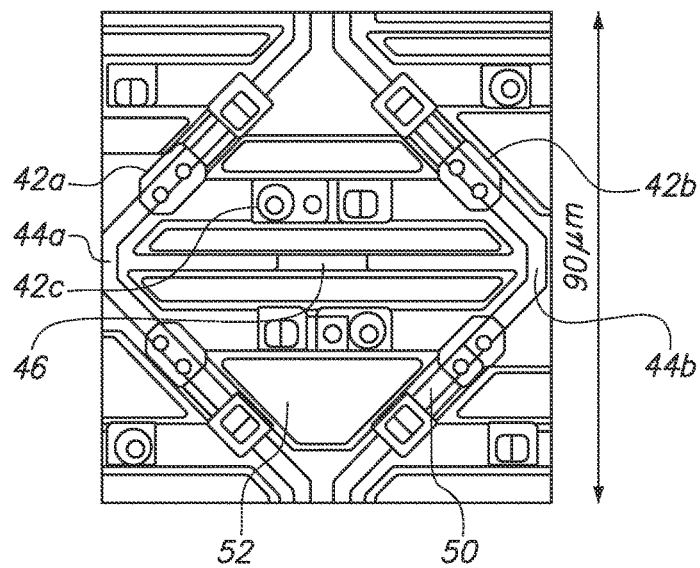
FIG. 6 is a top plan view of the single cell dual bi-SQUID of FIG. 4.

Referring now to FIG. 6, FIG. 6 is a microphotograph of the single diamond bi-SQUID of FIG. 4. FIG. 6 shows the implementation of the diamond-shaped dual bi-SQUID cell once fabricated. One such fabrication method that can be used is the HYPRES Nb fabrication process, as described in Niobium (Nb) process design rule, revision #24, Jan. 11, 2008, 11, available at http://www.hypres.com. $R_{shunt}$ is the shunting resistance and $V_c$ is the critical voltage across each of the JJ's. For the fabrication shown in FIG. 6, J1=J2=J3=0.25 mA, $R_{shunt}$=2.4 Ω, $V_c=I_cR_{sh}$=600 μV.

The cell 40 shown in FIG. 6 can be manufactured using all four Nb layers: a ground plane layer, two layers for junctions and inductors, and a top layer to implement a flux bias line 50 overlaying the bi-SQUID cells. The ground plane was used only under Nb layers forming bi-SQUID inductors and junctions in order to maintain their low specific inductance. However, ground plane can be partially removed from under inductor 46 to increase its inductance value, if desired. The ground plane can also be removed from the central area of the bi-SQUID loops (areas 52 in FIG. 6) to allow an external magnetic field to thread through the cell.

C. Implementation of 2D Diamond bi-SQUID SQIF Arrays.

1. Construction of 2D SQIF Array.

Figure 7:
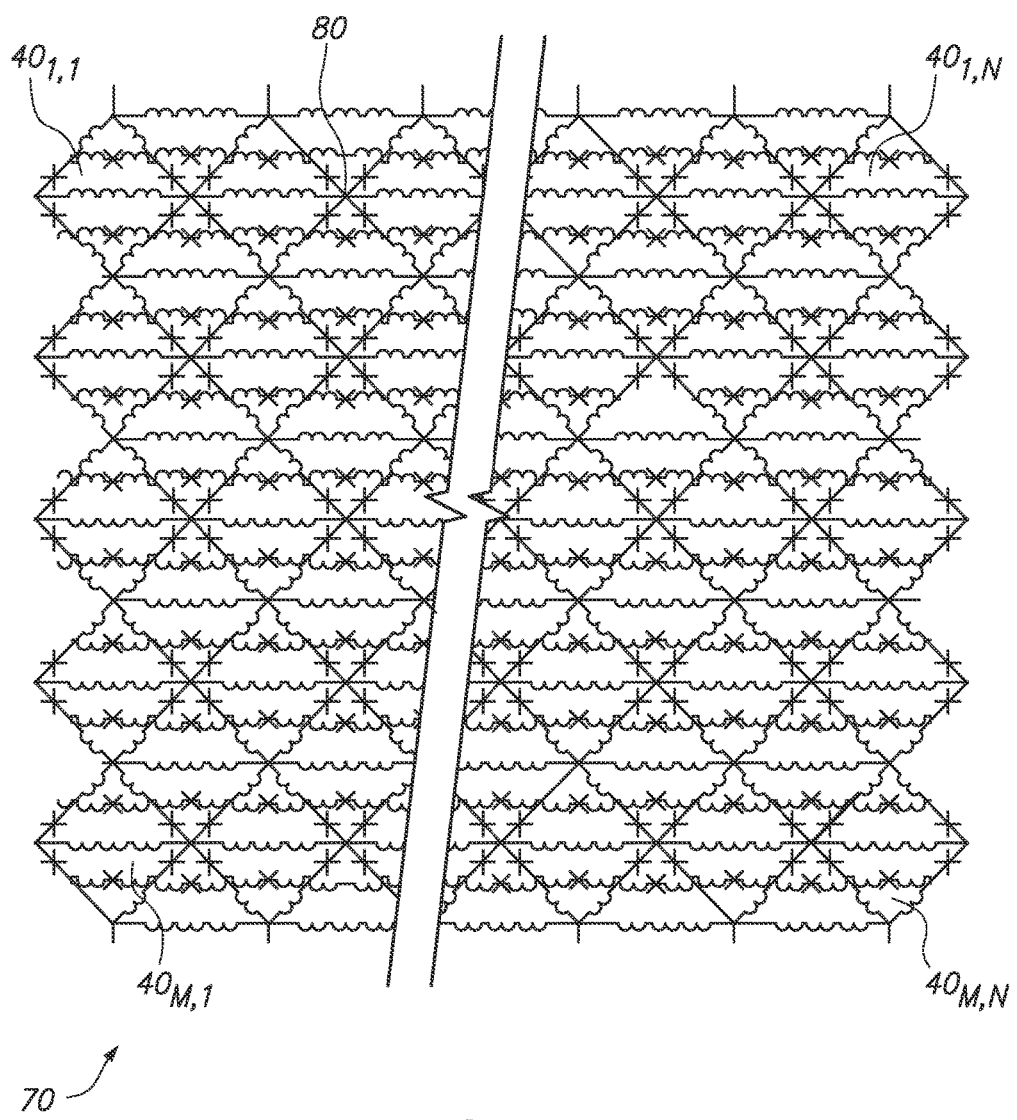
FIG. 7 is a schematic view of the 2D SQIF array of the present invention according to several embodiments, which illustrate a plurality of the cells of FIGS. 4 and 5.
Figure 8B:
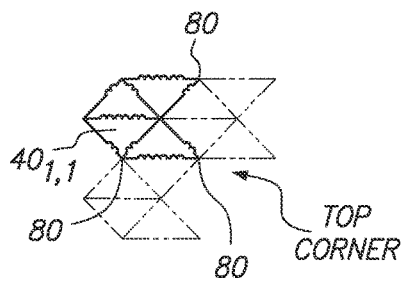
FIGS. 8a-8i are schematic views of the various boundary conditions for the 2D SQIF array of FIG. 7.
Figure 8C:
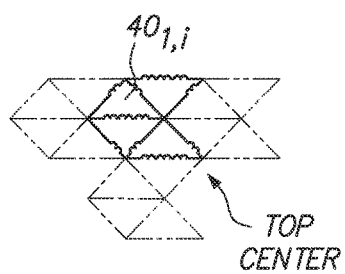
Figure 8D:
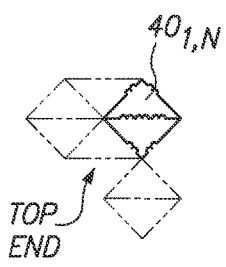
Figure 8E:
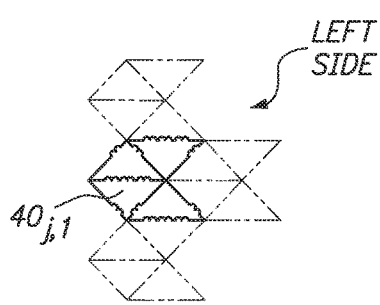
Figure 8A:
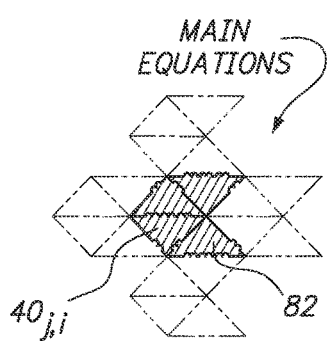
Figure 8F:
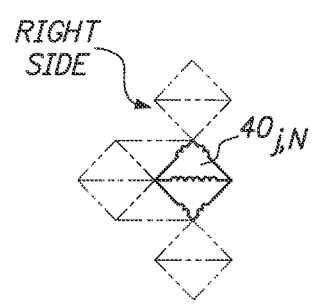
Figure 8G:
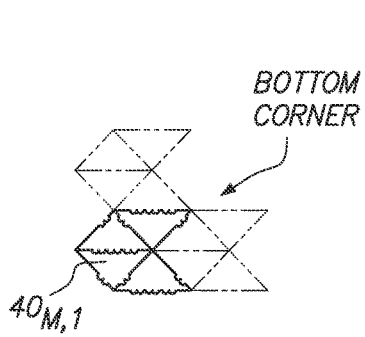
Figure 8H:
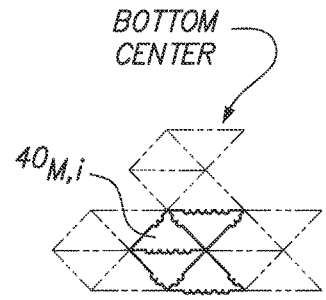
Figure 8I:
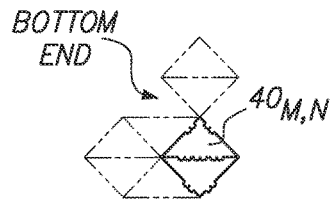
Figure 9:
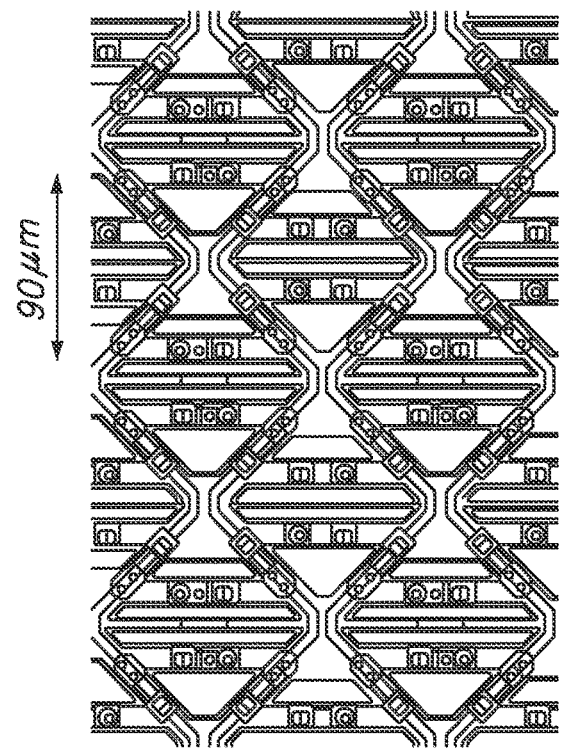
FIG. 9 is a top plan view of a portion of the 2D SQIF array of FIG. 7.

To construct the 2D SQIF array of the present invention according to several embodiments, and referring now to FIGS. 7-9, building blocks of dual bi-SQUID cells 40 like those shown in FIG. 6 can be used. The repeating pattern in the 2D array that is illustrated in FIGS. 7-9 can be a series of cells 40 having a diamond shape created by two bi-SQUIDs 20a, 20b, which can have the structure as recited above for cell 40 (See FIG. 4). An example of such as array is shown electrically and in top plan in FIG. 7. The phase equations that model the 2D diamond arrays can be derived in a similar way as the single diamond structure of bi-SQUIDs. But the above analysis in the previous section and Equations (5)-(7) and (9)-(11) only models the response for one cell 40. To model the effects for the SQIF array as a whole, the analysis can now be extended to the full 2D diamond array. But because of the tightly packed arrangement of diamond-shaped cells 40, each bi-SQUID shares its JJs and inductances with neighboring bi-SQUIDs. Stated differently, each bi-SQUID cell 40 affect adjacent bi-SQUID cells 40 as well of the bi-SQUIDs of other cells 40 in the array 70. Therefore to model the entire array, Kirchoff's law can be used to sum current thorugh each and every junciton for a network of cells 40 that share inductances, instead of a single cell. Also, the effects that each cell 40 has on every other cell in the 2D array, and the effects that occur at boundary conditions can be accounted for (again, using Kirchoff's law) in the methods of the present invention.

At the corners of the 2D SQIF array 70, each dual bi-SQUID cell 40 has a contact to three neighboring cells at cell junctions 80. FIGS. 8b, 8d, 8g and 8i illustrate this boundary condition at the respective upper left, upper right, lower left and lower right corners of the 2D SQIF array. FIGS. 8e and 8f illustrate the boundary conditions on the respective left side and right side of the 2D SQIF array. FIGS. 8c and 8h illustrate the respective top and bottom conditions on the 2D SQIF array. The array dc bias can be fed uniformly from the top bi-SQUID row (cells $40_{1,1}$ through $40_{1,N}$ of the 2D SQIF array 70). Similarly, the array can be grounded to the bottom bi-SQUID row (cells $40_{M,1}$ through $40_{M,N}$ or array 70 in FIG. 7). The inductively coupled flux bias line is overlaid on the top of the array forming loops for each column. The direction of the dc flux bias control current is from top to bottom of array 70 in FIG. 7. The 2-D array design in FIGS. 7-8 avoids the use of long parasitic wires, as every component of the array is an essential element of a bi-SQUID, which results in an efficient use of the available area.

To account for the boundary conditions in an M×N 2D array, and referring again to FIG. 7, The number of diamonds cells 40 in the vertical direction can be 2M and the number of bi-SQUIDs in the horizontal direction can be 2N-1. This means that, for example a 10×8 array can have 20×15=300 bi-SQUIDs. The segmenting of the array in the manner allows for the smallest repeated pattern grouping, which can further result in the simplest set of modeling equations for computational purposes. The 2D array equations are derived in pieces that include the diamond structure and two transition areas, as shown by area 82 in FIG. 8a. This segmentation of the array is the smallest repeatable pattern.

Using the above methodology, the equation for the 2D array cells in the interior of the array, i.e. cells $40_{j,i}$ where j=2 to M-1 and i=2 to N-1 as shown in FIG. 8a results in the following equations (13) through (20) in Appendix found at the end of this Specification. Next, the methodology was used for the top row of cells $40_{j,i}$ for j=1 and i=2, ..., N-1 (FIG. 8c) resulting in the development of equations (21) through (28) of the Appendix. Still further, the methodology was used to develop the equations (29) through (36), which model the bottom row of cells $40_{j,i}$ for j=M and i=2, ..., N-1 (FIG. 8h). In similar fashion, the equations that model the left side cells $40_{j,i}$ for j=2, ..., M-1 and i=1 (Equations (37) through (44), FIG. 8e), the top left hand corner cell $40_{1,1}$ (FIG. 8b and Equations (45) through (52)), the bottom left hand corner cell $40_{M,1}$ (FIG. 8g, Appendix Equations (53) through (60)) were developed. Finally, the equations for the rights side of array 70, cells $40_{j,i}$ for j=2, ..., M-1 and i=N of the array (FIG. 8f) were developed and listed as Equations (61) through (66) in the equations Appendix, and the equations for the top right hand corner cell $40_{1,N}$ (FIG. 8d, Equations (67) through (72)), and bottom right hand corner cell $40_{M,N}$ (FIG. 8i, Equations (73) through (78)) were developed. The net result is a matrix of sixty-six equations, Equations (13) through (78), which can accurately the behavior of the 2D SQIF array.

As described above for a single cell 40, once Equations (13)-(78) are developed and solved for phases ϕ and phase rates (derivatives of ϕ) for each JJ in each cell 40. These derivatives are used to calculate the average voltage response of the bi-SQUID array, which is the output measured from the fabricated bi-SQUID chips Next, the cell can be manufactured with the cell inductances that achieve the desired phase and phase rate (and by extension, the desired voltage response). The inductances, critical currents, normal state resistance, bias currents and external field are known or controllable. One way this has been accomplished in the prior art was by varying the loop size of bi-SQUID 20. But for SQIFarray 70, uniform loop sizes are needed for ease of manufacture of diamon cells 40 and 2D SQIF array 70. So, in order to vary the inductances in 2D SQIF array 70 while the a uniform loop size (area of the cell 40), the inductances, critical currents, normal state resistance, bias currents and external field are known or controllable. The arrays can be constructed by varying the area of triangle array cells 20 and ground plane hole sizes in a manner that reults in a normal Gaussian distribution of cell inductances.

FIG. 9 shows layout implementation of a portion of the 80×15 2D array of FIG. 7, using diamond dual bi-SQUID cells. The total area of the 2D array of dual-bi-SQUID cells shown in for an 80×15 2D array can be 1623 μm². The central area of each cell 40 contains ground plane openings to facilitate RF signal reception.

2. Experimental Investigation 2D SQIF Noise Properties

Figure 10:
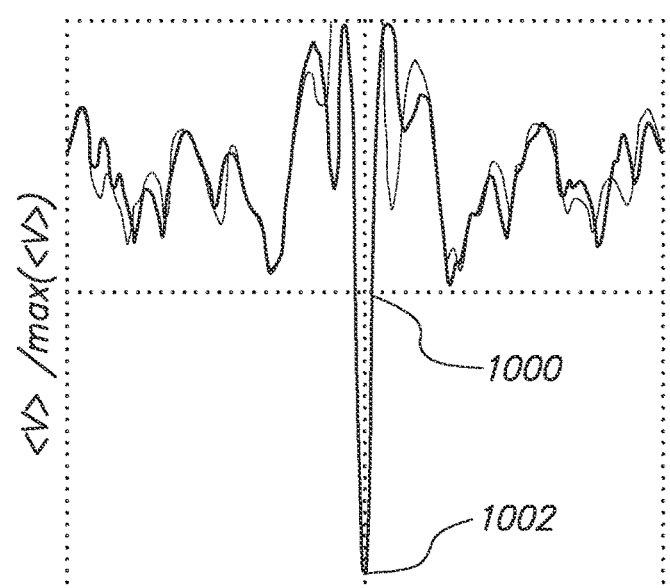
FIG. 10 is a graphical representation of the voltage response of the 2D SQIF array of FIG. 7 as a function of magnetic field strength.
Figure 11:
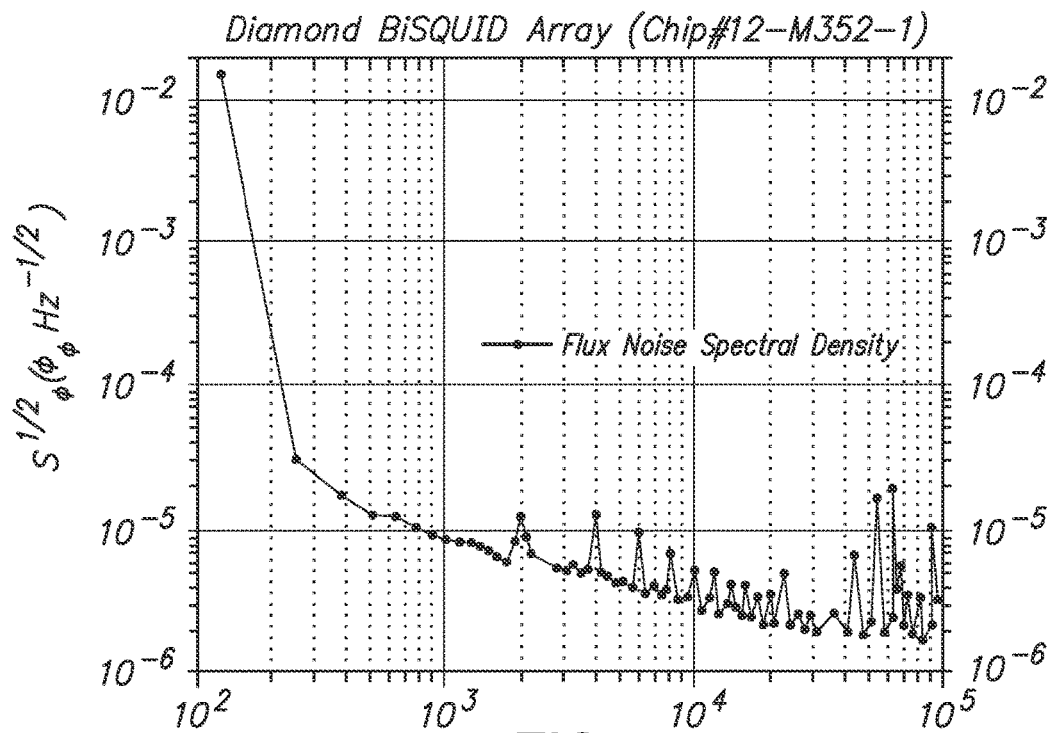
FIG. 11 is a graphical representation of graphical representation of the flux noise spectral density versus frequency at the mid-point of the positive slope of the anti-peak in FIG. 10.
Figure 12:
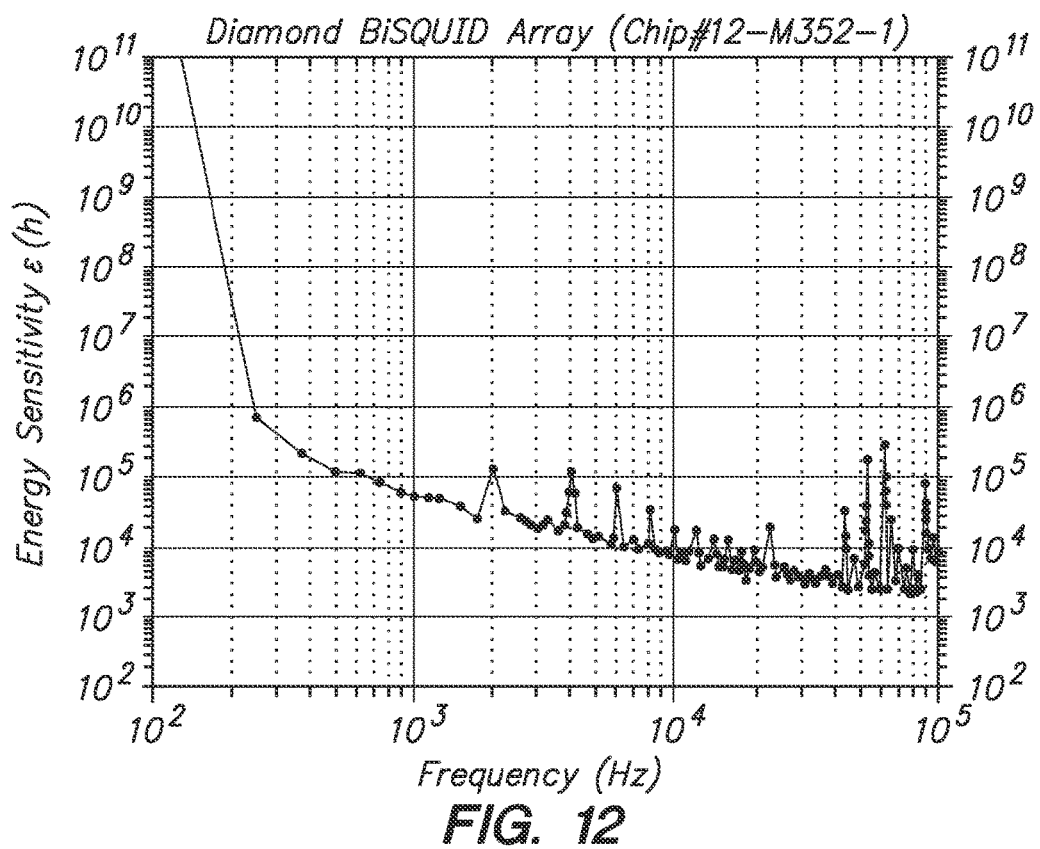
FIG. 12 is a graphical representation of energy sensitivity versus frequency at the mid-point of the positive slope of the anti-peak in FIG. 10.
Figure 13:
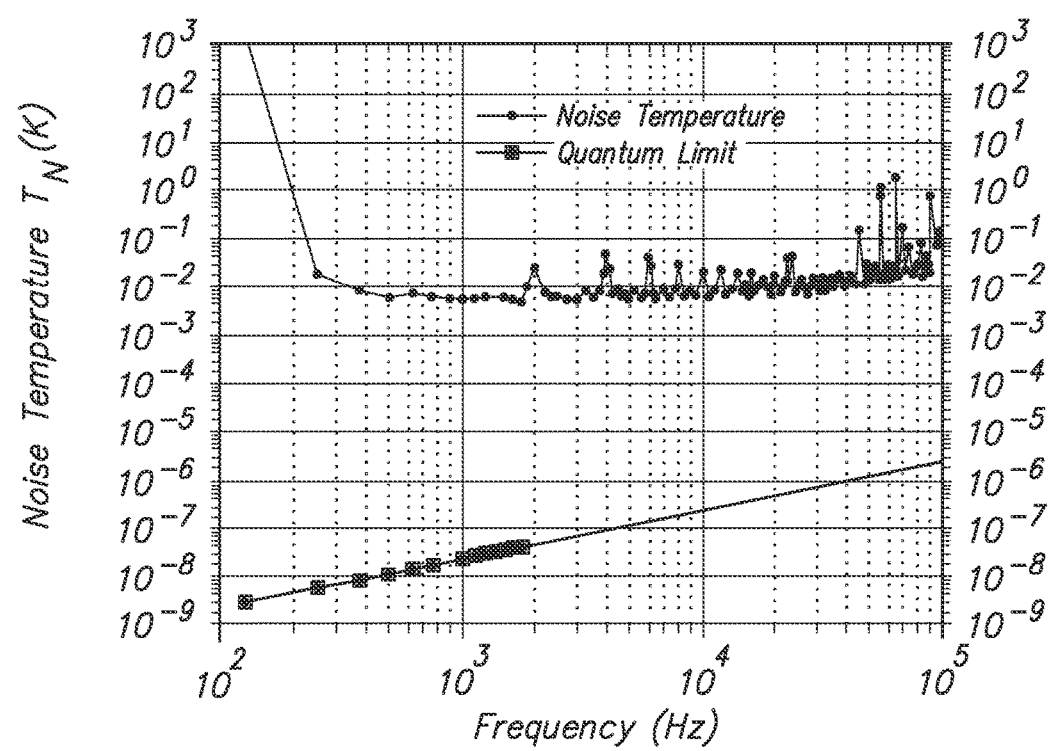
FIG. 13 is a graphical representation of noise temperature at the mid-point of the positive slope of the anti-peak in FIG. 10; and, FIG. 14 is a block diagram, which illustrates steps that can be taken to accomplish the methods of the present invention according to several embodiments.

FIG. 10 illustrates the measured flux-to-voltage characteristics of a 15×80 2D SQIF array of cell 40 of FIGS. 7-9, with a 70% Gaussian spread (σ=70%) of inductance values. Like FIG. 3 for SQUIDs and bi-SQUIDs, FIG. 10 is a graph of the average voltage, <V>, of the 2D SQIF array at a point in $x_e$, which is the mean value of the voltage over time. As shown in FIG. 10, the measured flux/voltage characteristic for σ=70% is 50 mV/div 0.5 mA/div, max voltage=295 mV, ΔV/ΔI (flux bias) ~735 V/A. FIGS. 11-13 show the corresponding flux noise measurement at the mid-point of the positive slope of the anti-peak (point 1002 of peak 1000 in FIG. 10). As can be seen from FIG. 11, the flux noise spectral density can approach $2\times 10^{-6}\Phi_0/\sqrt{Hz}$, which is the expected value for this size array. FIGS. 12 and 13 show the corresponding energy characteristics of the (15×80) bi-SQUID SQIF array, which were calculated as follows:

Noise energy per unit bandwidth via flux noise in a SQUID:

$$\varepsilon(f) = \frac{S_\Phi(f)}{2L}, \quad (79)$$

where f is frequency, L–inductance of bi-SQUID calculated from the measured seperately $\Delta I_c$ modulations of the curve defined as $$L = \frac{\Phi_0}{\Delta I_c};$$

and,
Noise temperature:

$$T_N = \frac{\pi f \varepsilon(f)}{k_B} \quad (80)$$

where $k_B$ is Boltzmann's constant.

As shown by FIGS. 10-13, a well-defined zero-field anti-peak for a 2D SQIF array of cells 40 can be maintained if the mutual inductances between cells and the boundary conditions are accounted for. Stated differently, more bi-SQUID's can be packed into a corresponding areas using the methods of the present invention without sacrificing the overall linearity anti-peak response of the 2D SQIF array, when considered as a whole.

3. 2D SQIF Array Antenna Sensitivity Analysis

The sensitivities illustrated in FIGS. 10-13 were based on a SQIF-based antenna, by assuming that the area for a single diamond shaped (double) bi-SQUID cell 40 is $1.62\times 10^{-9}$ m². Using that as the effective area for cell 40, multiplying by 15×80/2 to account for the number of individual bi-SQUIDs in the array, and taking the flux noise from FIG. 8(*b*) as $2\times 10^{-6}\Phi_0/\sqrt{Hz}$, gives a field sensitivity of 4.25 fT/$\sqrt{Hz}$. Assuming a scaling as a function of $\sqrt{N}$, the field noise for a 1000×2000 array would be 0.104 fT/$\sqrt{Hz}$ at 100 kHz. Approximating the physical dimension of the diamond cell 40 as 71 μm×71 μm means that the diamond occupies an area of $5\times 10^{-9}$ m² (consistent with the effective area of the diamond shaped bi-SQUID). Thus a 1000×2000 array would occupy an area of 50 cm², since each diamond contains two bi-SQUIDs. This corresponds to a square with 7.1 cm on a side. A corresponding linear (1D) array of the prior art, which would essentially be 2,000,000 bi-SQUIDs that are meandered in series, would require a much larger area, an area of 10,562 cm².

Figure 14:
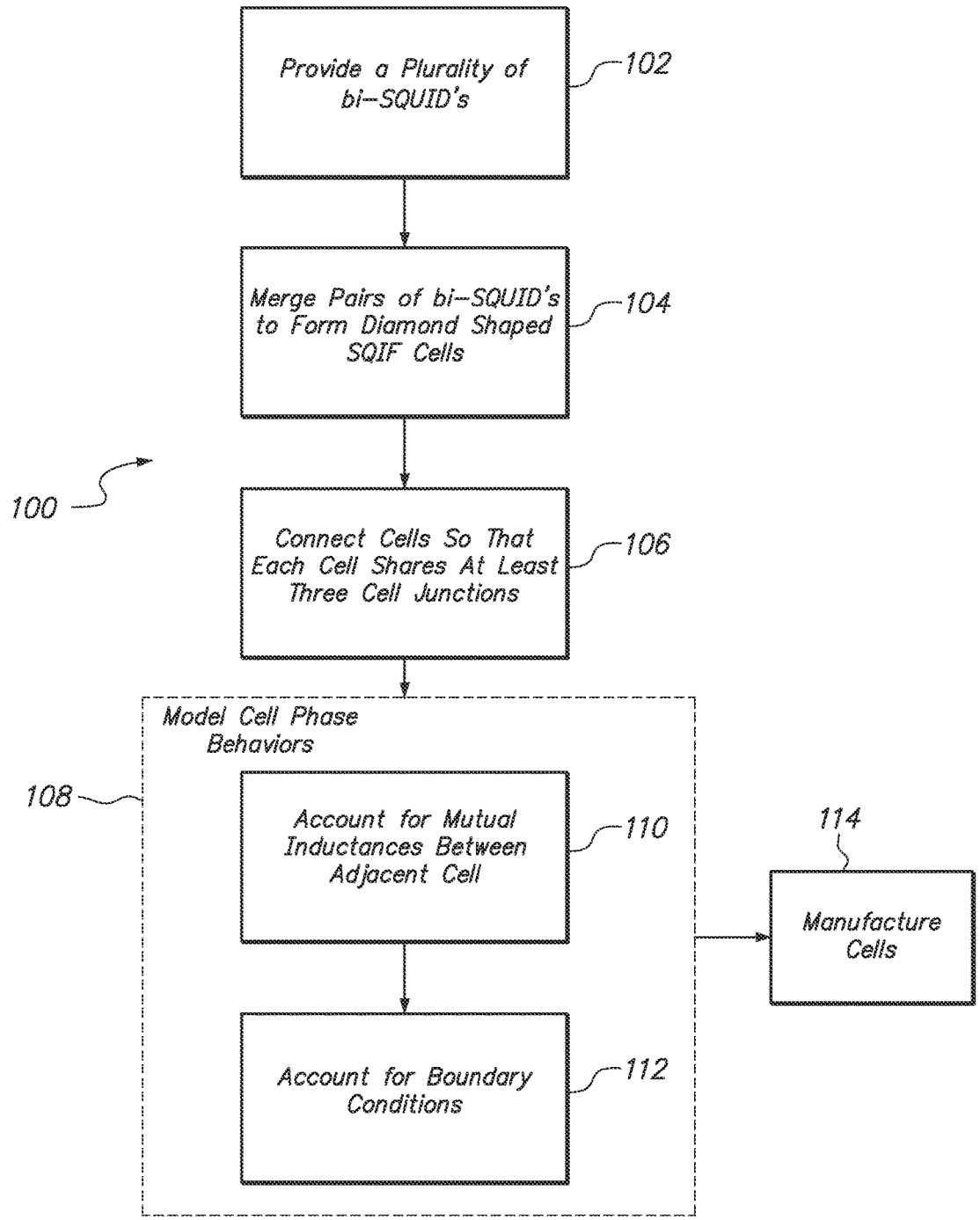

Referring now to FIG. 14, a block diagram 100 that illustrates steps that can be taken to practice the methods of the present invention according to several embodiments is shown. As shown method 100 can include the initial step 102 of providing a plurality of bi-SQUID's 20. The bi-SQUIDs 20 can have the structure as described above. The methods can further include the step 104 of merging pairs of bi-SQUID's 20 into diamond-shaped cells 40 and connecting the ells so that each cell 40 shares at least three cell junctions 80 (step 106). Next, the methods according to several embodiments can include the step 108 of modeling the phases of the 2D SQIF array. Step 108 can further be accomplished by accounting for mutual inductances between cells 40 (step 110 in FIG. 14) and by using the equations (13) through (78) of the Appendix to model the boundarys conditions of array 70 (step 112 in FIG. 14). As shown by step 114 in FIG. 14, the methods according to several embodiments can further include the step of manufacturing cells 40 with inductances that achieve the phases and phase behavior resulting form the accomplishment of step 108, in order the achieve the anti-peak response shown in FIG. 10. For embodiments the loop size of cell 40 is uniform, one way to do this can be to vary the ground plane hole size, as discussed above.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

APPENDIX

2D Diamond Array Governing Equations

For the model equations below, the variables $\phi_{m,i,j}$, m=1, . . . ,8, i=1, . . . , N, j=1, . . . , M are the phases on each of the Josephson junctions (m=1, . . . ,8). The dots denote the time differentiation with normalized time $\tau=\Omega_c t$, where t is time and $$\omega_c = \frac{2eI_c R_N}{\hbar}$$

is the normalized time constant. The parameter $R_N$ in $\Omega_c$ is the normal state resistance of the Josephson junctions, $I_c$ is the critical current of the Josephson junctions, e is the charge of an electron, and h is the reduced Planck constant.

$$i_b = \frac{I_b}{I_c}$$

is the normalized bias current, where $I_b$ is the bias current.

$$\Phi_0 \equiv \frac{h}{2e} \approx 2.07 \times 10^{-15}$$

tesla meter squared is the flux quantum, where h is Plank's constant and 2e is the charge on the Cooper pair. The normalized critical current on the third junction is $$i_{c3,i,j} = \frac{I_{c3,i,j}}{I_c},$$

the normalized critical current of the sixth junction is $$i_{c6,i,j} = \frac{I_{c6,i,j}}{I_c},$$

the normalized critical current of the seventh junction is $$i_{c7,i,j} = \frac{I_{c7,i,j}}{I_c},$$

the normalized critical current of the eighth junction is $$i_{c8,i,j} = \frac{I_{c8,i,j}}{I_c},$$

$$I_{c1,i,j} = I_{c2,i,j} = I_{c4,i,j} = I_{c5,i,j} = I_0,$$

$$x_{e,i,j} = \frac{B_e}{\Phi_0}$$

is the normalized external magnetic flux per unit area and $a_{n,i,j}$, $n=1, \ldots, 4$ is the bi-SQUID area. The approximate assumptions that $a_{1,i,j} = L_{1,i,j} + L_{2a,i,j} + L_{2b,i,j}$, $a_2 = L_{1,i,j} + L_{5a,i,j} + L_{5b,i,j}$, $a_{3,i,j} = L_{4,i,j} + L_{2a,i+1,j} + L_{2b,i,j}$, $a_4 = L_{4,i,j+1} + L_{5a,i+1,j} + L_{5b,i,j}$ are used.

Using the assumptions and variables able, the equations for the array 70 interior cells, i.e, Cells $\mathbf{40}_{j,i}$ for $j=2, \ldots, M-1$ and $i=2, \ldots, N-1$ become (8 equations):

$$L_{2a,i,j}(\dot{\varphi}_{1,i,j} + \dot{\varphi}_{1,i-1,j} - \dot{\varphi}_{3,i,j}) - L_{2b,i,j}(\dot{\varphi}_{2,i,j} + \dot{\varphi}_{3,i,j} - \dot{\varphi}_{7,i,j}) + \quad \text{Equation (13)}$$

$$L_{1,i,j}\left(\sum_{k=1}^{i}\dot{\varphi}_{1,k,j} + \sum_{k=1}^{i-1}\dot{\varphi}_{2,k,j} - \dot{\varphi}_{3,i,j} - \sum_{k=1}^{i}\dot{\varphi}_{4,k,j} - \sum_{k=1}^{i-1}\dot{\varphi}_{5,k,j} - \dot{\varphi}_{6,i,j}\right) = \varphi_{2,i,j} - \varphi_{1,i,j} + 2\pi x_e a_{1,i,j} -$$

$$L_{2a,i,j}(\sin\varphi_{1,i,j} + i_{c7,i-1,j}\sin\varphi_{7,i-1,j} - i_{c3,i,j}\sin\varphi_{3,i,j}) +$$

$$L_{2b,i,j}(\sin\varphi_{2,i,j} + i_{c3,i,j}\sin\varphi_{3,i,j} - i_{c7,i,j}\sin\varphi_{7,i,j}) -$$

$$L_{1,i,j}\left(\sum_{k=1}^{i}\sin\varphi_{1,k,j} + \sum_{k=1}^{i-1}\sin\varphi_{2,k,j} - i_{c3,i,j}\sin\varphi_{3,i,j} - \sum_{k=1}^{i}\sin\varphi_{4,k,j} - \sum_{k=1}^{i-1}\sin\varphi_{5,k,j} - i_{c6,i,j}\sin\varphi_{6,i,j}\right)$$

$$L_{2b,i,j}(\dot{\varphi}_{2,i,j} + \dot{\varphi}_{3,i,j} - \dot{\varphi}_{7,i,j}) - \quad \text{Equation (14)}$$

$$L_{2a,i,j}(\dot{\varphi}_{1,i+1,j} + \dot{\varphi}_{7,i,j} - \dot{\varphi}_{3,i+1,j}) -$$

$$L_{4,i,j}\left(\sum_{k=1}^{i}\dot{\varphi}_{4,k,j-1} + \sum_{k=1}^{i}\dot{\varphi}_{5,k,j-1} - \sum_{k=1}^{i}\dot{\varphi}_{1,k,j} - \sum_{k=1}^{i}\dot{\varphi}_{2,k,j}\right) =$$

$$\varphi_{1,i+1,j} - \varphi_{2,i,j} + 2\pi x_e a_{3,i,j} -$$

$$L_{2b,i,j}(\sin\varphi_{2,i,j} + i_{c3,i,j}\sin\varphi_{3,i,j} - i_{c7,i,j}\sin\varphi_{7,i,j}) +$$

$$L_{2a,i+1,j}(\sin\varphi_{1,i+1,j} + i_{c7,i,j}\sin\varphi_{7,i,j} - i_{c3,i+1,j}\sin\varphi_{3,i+1,j}) +$$

$$L_{4,i,j}\left(\sum_{k=1}^{i}\sin\varphi_{4,k,j-1} + \sum_{k=1}^{i}\sin\varphi_{5,k,j-1} - \sum_{k=1}^{i}\sin\varphi_{1,k,j} - \sum_{k=1}^{i}\sin\varphi_{2,k,j}\right)$$

$$(L_{3a,i,j} + L_{3b,i,j})\dot{\varphi}_{3,i,j} = \varphi_{2,i,j} - \varphi_{1,i,j} - \varphi_{3,i,j} - (L_{3a,i,j} + L_{3b,i,j})i_{c3,i,j}\sin\varphi_{3,i,j} \quad \text{Equation (15)}$$

$$L_{5a,i,j}(\dot{\varphi}_{4,i,j} + \dot{\varphi}_{6,i,j} - \dot{\varphi}_{8,i-1,j}) - L_{5b,i,j}(\dot{\varphi}_{8,i,j} + \dot{\varphi}_{5,i,j} - \dot{\varphi}_{6,i,j}) - \quad \text{Equation (16)}$$

$$L_{1,i,j}\left(\sum_{k=1}^{i}\dot{\varphi}_{1,k,j} + \sum_{k=1}^{i-1}\dot{\varphi}_{2,k,j} - \dot{\varphi}_{3,i,j} - \sum_{k=1}^{i}\dot{\varphi}_{4,k,j} - \sum_{k=1}^{i-1}\dot{\varphi}_{5,k,j} - \dot{\varphi}_{6,i,j}\right) = \varphi_{5,i,j} - \varphi_{4,i,j} + 2\pi x_e a_{2,i,j} -$$

$$L_{2a,i,j}(\sin\varphi_{4,i,j} + i_{c6,i,j}\sin\varphi_{6,i,j} - i_{c8,i-1,j}\sin\varphi_{8,i-1,j}) +$$

$$L_{5b,i,j}(\sin\varphi_{5,i,j} + i_{c8,i,j}\sin\varphi_{8,i,j} - i_{c6,i,j}\sin\varphi_{6,i,j}) +$$

$$L_{1,i,j}\left(\sum_{k=1}^{i}\sin\varphi_{1,k,j} + \sum_{k=1}^{i-1}\sin\varphi_{2,k,j} - i_{c3,i,j}\sin\varphi_{3,i,j} - \sum_{k=1}^{i}\sin\varphi_{4,k,j} - \sum_{k=1}^{i-1}\sin\varphi_{5,k,j} - i_{c6,i,j}\sin\varphi_{6,i,j}\right)$$

$$L_{5b,i,j}(\dot{\varphi}_{5,i,j} + \dot{\varphi}_{8,i,j} - \dot{\varphi}_{6,i,j}) - \quad \text{Equation (17)}$$

$$L_{5a,i+1,j}(\dot{\varphi}_{4,i+1,j} + \dot{\varphi}_{6,i+1,j} - \dot{\varphi}_{8,i,j}) +$$

$$L_{4,i,j+1}\left(\sum_{k=1}^{i}\dot{\varphi}_{4,k,j} + \sum_{k=1}^{i}\dot{\varphi}_{5,k,j} - \sum_{k=1}^{i}\dot{\varphi}_{1,k,j+1} -\right.$$

-continued $$L_{2b,i,j}\left(\sum_{k=1}^{i}\dot{\varphi}_{2,k,j+1}\right) = \varphi_{4,i+1,j} - \varphi_{5,i,j} + 2\pi x_e a_{4,i,j} -$$

$$L_{5b,i,j}(\sin\varphi_{5,i,j} + i_{c8,i,j}\sin\varphi_{8,i,j} - i_{c6,i,j}\sin\varphi_{6,i,j}) +$$

$$L_{5a,i+1,j}(\dot{\varphi}_{4,i+1,j} + i_{c6,i+1,j}\sin\varphi_{6,i+1,j} - i_{c8,i,j}\sin\varphi_{8,i,j}) -$$

$$L_{4,i,j+1}\left(\sum_{k=1}^{i}\sin\varphi_{4,k,j} + \sum_{k=1}^{i}\sin\varphi_{5,k,j} - \sum_{k=1}^{i}\sin\varphi_{1,k,j+1} - \sum_{k=1}^{i}\sin\varphi_{2,k,j+1}\right)$$

$$(L_{6a,i,j}+L_{6b,i,j})\dot{\phi}_{6,i,j}=\phi_{4,i,j}-\phi_{5,i,j}-\phi_{6,i,j}-(L_{6a,i,j}+L_{6b,i,j})i_{c3,i,j}\sin\phi_{3,i,j} \quad \text{Equation (18)}$$

$$(L_{7a,i,j}+L_{7b,i,j})\dot{\phi}_{7,i,j}+L_{2a,i+1,j}(\dot{\phi}_{1,i+1,j}+\dot{\phi}_{7,i,j}-\dot{\phi}_{3,i+1,j})-L_{2b,i,j}(\dot{\phi}_{2,i,j}+\dot{\phi}_{3,i,j}-\dot{\phi}_{7,i,j})=-\phi_{7,i,j}-(L_{7a,i,j}+L_{7b,i,j})i_{c7,i,j}\sin\phi_{7,i,j}-L_{2a,i+1,j}(\sin\phi_{1,i+1,j}+i_{c7,i,j}\sin\phi_{7,i,j}-i_{c3,i+1,j}\sin\phi_{3,i+1,j})+L_{2b,i,j}(\sin\phi_{2,i,j}+i_{c3,i,j}\sin\phi_{3,i,j}-i_{c7,i,j}\sin\phi_{7,i,j}) \quad \text{Equation (19)}$$

$$(L_{8a,i,j}+L_{8b,i,j})\dot{\phi}_{8,i,j}+L_{5b,i,j}(\dot{\phi}_{5,i,j}+\dot{\phi}_{8,i,j}-\dot{\phi}_{6,i,j})-L_{5b,i+1,j}(\dot{\phi}_{4,i+1,j}+\dot{\phi}_{6,i+1,j}-\dot{\phi}_{8,i,j})=-\phi_{8,i,j}-(L_{8a,i,j}+L_{8b,i,j})i_{c8,i,j}\sin\phi_{7,i,j}-L_{5b,i,j}(\sin\phi_{5,i,j}+i_{c8,i,j}\sin\phi_{8,i,j}-i_{c6,i,j}\sin\phi_{6,i,j})+L_{5a,i+1,j}(\sin\phi_{4,i+1,j}+i_{c6,i+1,j}\sin\phi_{6,i+1,j}-i_{c8,i,j}\sin\phi_{8,i,j}) \quad \text{Equation (20)}$$

For the cells in the top row of array 70, i.e. for cells 40$_{j,i}$ for j=1 and i=2, . . . , N-1 (8 equations):

$$L_{2a,i,j}(\dot{\varphi}_{1,i,1} + \dot{\varphi}_{7,i-1,1} - \dot{\varphi}_{3,i,1}) - \quad \text{Equation (21)}$$

$$L_{2b,i,1}(\dot{\varphi}_{2,i,1} + \dot{\varphi}_{3,i,1} - \dot{\varphi}_{7,i,1}) +$$

$$L_{1,i,1}\left(\sum_{k=1}^{i}\dot{\varphi}_{1,k,1} + \sum_{k=1}^{i-1}\dot{\varphi}_{2,k,1} - \dot{\varphi}_{3,i,1} - \sum_{k=1}^{i}\dot{\varphi}_{4,k,1} - \sum_{k=1}^{i-1}\dot{\varphi}_{5,k,1} - \dot{\varphi}_{6,i,1}\right) = \varphi_{2,i,1} - \varphi_{1,i,1} + 2\pi x_e a_{1,i,1} -$$

$$L_{2a,i,1}(\sin\varphi_{1,i,1} + i_{c7,i-1,i}\sin\varphi_{7,i-1,1} - i_{c3,i,1}\sin\varphi_{3,i,1}) +$$

$$L_{2b,i,1}(\sin\varphi_{2,i,1} + i_{c3,i,1}\sin\varphi_{3,i,1} - i_{c7,i,1}\sin\varphi_{7,i,1}) -$$

$$L_{1,i,1}\left(\sum_{k=1}^{i}\sin\varphi_{1,k,1} + \sum_{k=1}^{i-1}\sin\varphi_{2,k,1} - i_{c3,i,1}\sin\varphi_{3,i,1} - \sum_{k=1}^{i}\sin\varphi_{4,k,1} - \sum_{k=1}^{i-1}\sin\varphi_{5,k,1} - i_{c6,i,1}\sin\varphi_{6,i,1}\right)$$

$$L_{2b,i,1}(\dot{\varphi}_{2,i,1} + \dot{\varphi}_{3,i,1} - \dot{\varphi}_{7,i,1}) - \quad \text{Equation (22)}$$

$$L_{2a,i+1,1}(\dot{\varphi}_{1,i+1,1} + \dot{\varphi}_{7,i,1} - \dot{\varphi}_{3,i+1,1}) +$$

$$L_{4,i,1}\left(\sum_{k=1}^{i}\dot{\varphi}_{1,k,1} + \sum_{k=1}^{i}\dot{\varphi}_{2,k,1}\right) =$$

$$i\times L_{4,i,1}i_b + \varphi_{1,i+1,1} - \varphi_{2,i,1} + 2\pi x_e a_{3f,i,1} -$$

$$L_{2b,i,1}(\sin\varphi_{2,i,1} + i_{c3,i,1}\sin\varphi_{3,i,1} - i_{c7,i,1}\sin\varphi_{7,i,1}) +$$

$$L_{2a,i+1,1}(\sin\varphi_{1,i+1,1} + i_{c7,i,1}\sin\varphi_{7,i,1} - i_{c3,i+1,1}\sin\varphi_{3,i+1,1}) -$$

$$L_{4,i,1}\left(\sum_{k=1}^{i}\sin\varphi_{1,k,1} + \sum_{k=1}^{i}\sin\varphi_{2,k,1}\right)$$

$$(L_{3a,i,1}+L_{3b,i,1})\dot{\phi}_{3,i,1}=\phi_{2,i,1}-\phi_{1,i,1}-\phi_{3,i,1}-(L_{3a,i,1}+L_{3b,i,1})i_{c3,i,1}\sin\phi_{3,i,1} \quad \text{Equation (23)}$$

$$L_{5a,i,1}(\dot{\varphi}_{4,i,1} + \dot{\varphi}_{6,i,1} - \dot{\varphi}_{8,1-i,1}) - \quad \text{Equation (24)}$$

$$L_{5b,i,1}(\dot{\varphi}_{8,i,1} + \dot{\varphi}_{5,i,1} - \dot{\varphi}_{6,i,j}) -$$

$$L_{1,i,1}\left(\sum_{k=1}^{i}\dot{\varphi}_{1,k,1} + \sum_{k=1}^{i-1}\dot{\varphi}_{2,k,1} - \dot{\varphi}_{3,i,1} - \sum_{k=1}^{i}\dot{\varphi}_{4,k,1} - \sum_{k=1}^{i-1}\dot{\varphi}_{5,k,1} - \dot{\varphi}_{6,i,1}\right) = \varphi_{5,i,1} - \varphi_{4,i,1} + 2\pi x_e a_{2,i,1} -$$

$$L_{2a,i,1}(\sin\varphi_{4,i,1} + i_{c6,i,1}\sin\varphi_{6,i,1} - i_{c8,i-1,1}\sin\varphi_{8,i-1,1}) +$$

$$L_{5b,i,1}(\sin\varphi_{5,i,1} + i_{c8,i,1}\sin\varphi_{8,i,1} - i_{c6,i,1}\sin\varphi_{6,i,1}) +$$

$$L_{1,i,1}\left(\sum_{k=1}^{i}\sin\varphi_{1,k,1} + \sum_{k=1}^{i-1}\sin\varphi_{2,k,1} - i_{c3,i,1}\sin\varphi_{3,i,1} - \sum_{k=1}^{i}\sin\varphi_{4,k,1} - \sum_{k=1}^{i-1}\sin\varphi_{5,k,1} - i_{c6,i,1}\sin\varphi_{6,i,1}\right)$$

$$L_{5b,i,1}(\dot{\varphi}_{5,i,1} + \dot{\varphi}_{8,i,1} - \dot{\varphi}_{6,i,1}) - \quad \text{Equation (25)}$$

$$L_{5a,i+1,1}(\dot{\varphi}_{4,i+1,1} + \dot{\varphi}_{6,i+1,1} - \dot{\varphi}_{8,i,1}) +$$

$$L_{4,i,2}\left(\sum_{k=1}^{i}\dot{\varphi}_{4,k,1} + \sum_{k=1}^{i}\dot{\varphi}_{5,k,1} - \sum_{k=1}^{i}\dot{\varphi}_{1,k,2} - \sum_{k=1}^{i}\dot{\varphi}_{2,k,2}\right) =$$

$$\varphi_{4,i+1,1} - \varphi_{5,i,1} + 2\pi x_e a_{4,i,1} -$$

$$L_{5b,i,1}(\sin\varphi_{5,i,1} + i_{c8,i,1}\sin\varphi_{8,i,1} - i_{c6,i,1}\sin\varphi_{6,i,1}) +$$

$$L_{5a,i+1,1}(\sin\varphi_{4,i+1,1} + i_{c6,i+1,1}\sin\varphi_{6,i+1,1} - i_{c8,i,1}\sin\varphi_{8,i,1}) -$$

$$L_{4,i,2}\left(\sum_{k=1}^{i}\sin\varphi_{4,k,1} + \sum_{k=1}^{i}\sin\varphi_{5,k,1} - \sum_{k=1}^{i}\sin\varphi_{1,k,2} - \sum_{k=1}^{i}\sin\varphi_{2,k,2}\right)$$

$$(L_{6a,i,1}+L_{6b,i,1})\dot{\phi}_{6,i,1}=\phi_{4,i,1}-\phi_{5,i,1}-\phi_{6,i,1}-(L_{6a,i,1}+L_{6b,i,1})i_{c3,i,1}\sin\phi_{3,i,1} \quad \text{Equation (26)}$$

$$(L_{7a,i,1}+L_{7b,i,1})\dot{\phi}_{7,i,1}+L_{2a,i+1,1}(\dot{\phi}_{1,i+1,1}+\dot{\phi}_{7,i,1}-\dot{\phi}_{3,i+1,1})-L_{2b,i,1}(\dot{\phi}_{2,i,1}+\dot{\phi}_{3,i,1}-\dot{\phi}_{7,i,1})=-\phi_{7,i,1}-(L_{7a,i,1}+L_{7b,i,1})i_{c7,i,1}\sin\phi_{7,i,1}-L_{2a,i+1,1}(\sin\phi_{1,i+1,1}+i_{c7,i,1}\sin\phi_{7,i,1}-i_{c3,i+1,1}\sin\phi_{3,i+1,1})+L_{2b,i,1}(\sin\phi_{2,i,1}+i_{c3,i,1}\sin\phi_{3,i,1}-i_{c7,i,1}\sin\phi_{7,i,1}) \quad \text{Equation (27)}$$

$$(L_{8a,i,1}+L_{8b,i,1})\dot{\phi}_{8,i,1}+L_{5b,i,1}(\dot{\phi}_{5,i,1}+\dot{\phi}_{8,i,1}-\dot{\phi}_{6,i,1})-L_{5a,i+1,1}(\dot{\phi}_{4,i+1,1}+\dot{\phi}_{6,i+1,1}-\dot{\phi}_{8,i,1})=-\phi_{8,i,1}-(L_{8a,i,1}+L_{8b,i,1})i_{c8,i,1}\sin\phi_{7,i,1}-L_{5b,i,1}(\sin\phi_{5,i,1}+i_{c8,i,1}\sin\phi_{8,i,1}-i_{c6,i,1}\sin\phi_{6,i,1})+L_{5a,i+1,1}(\sin\phi_{4,i+1,1}+i_{c6,i+1,1}\sin\phi_{6,i+1,1}-i_{c8,i,1}\sin\phi_{8,i,1}) \quad \text{Equation (28)}$$

In similar fashion, the phases for the bottom row cells in array 70, i.e., cells 40$_{j,i}$ for j=M and i=2, . . . , N-1 (8 equations):

$$L_{2a,i,M}(\dot{\varphi}_{1,i,M} + \dot{\varphi}_{7,i-1,M} - \dot{\varphi}_{3,i,M}) - \quad \text{Equation (29)}$$

$$L_{2b,i,M}(\dot{\varphi}_{2,i,M} + \dot{\varphi}_{3,i,M} - \dot{\varphi}_{7,i,M}) +$$

$$L_{1,i,M}\left(\sum_{k=1}^{i}\dot{\varphi}_{1,k,M} + \sum_{k=1}^{i-1}\dot{\varphi}_{2,k,M} - \dot{\varphi}_{3,i,M} -\right.$$

-continued $$\sum_{k=1}^{i}\dot{\varphi}_{4,k,M}-\sum_{k=1}^{i-1}\dot{\varphi}_{5,k,M}-\dot{\varphi}_{6,i,M}\Bigg)=$$

$$\varphi_{2,i,M}-\varphi_{1,i,M}+2\pi x_e a_{1,i,M}-L_{2a,i,M}(\sin\varphi_{1,i,M}+$$

$$i_{c7,i-1,M}\sin\varphi_{7,i-1,M}-i_{c3,i,M}\sin\varphi_{3,i,M})+$$

$$L_{2b,i,M}(\sin\varphi_{2,i,M}+i_{c3,i,M}\sin\varphi_{3,i,M}-i_{c7,i,M}\sin\varphi_{7,i,M})-$$

$$L_{1,i,M}\Bigg(\sum_{k=1}^{i}\sin\varphi_{1,k,M}+\sum_{k=1}^{i-1}\sin\varphi_{2,k,M}-i_{c3,i,M}\sin\varphi_{3,i,M}-$$

$$\sum_{k=1}^{i}\sin\varphi_{4,k,M}-\sum_{k=1}^{i-1}\sin\varphi_{5,k,M}-i_{c6,i,M}\sin\varphi_{6,i,M}\Bigg)$$

$$L_{2b,i,M}(\dot{\varphi}_{2,i,M}+\dot{\varphi}_{3,i,M}-\dot{\varphi}_{7,i,M})- \quad \text{Equation (30)}$$

$$L_{2a,i+1,M}(\dot{\varphi}_{1,i+1,M}+\dot{\varphi}_{7,i,M}-\dot{\varphi}_{3,i+1,M})-$$

$$L_{4,i,M}\Bigg(\sum_{k=1}^{i}\dot{\varphi}_{4,k,M-1}+\sum_{k=1}^{i}\dot{\varphi}_{5,k,M-1}-\sum_{k=1}^{i}\dot{\varphi}_{1,k,M}-$$

$$\sum_{k=1}^{i}\dot{\varphi}_{2,k,M}\Bigg)=\varphi_{1,i+1,M}-\varphi_{2,i,M}+2\pi x_e a_{3,i,M}-$$

$$L_{2b,i,M}(\sin\varphi_{2,i,M}+i_{c3,i,M}\sin\varphi_{3,i,M}-i_{c7,i,M}\sin\varphi_{7,i,M})+$$

$$L_{2a,i+1,M_i}(\sin\varphi_{1,i+1,M}+i_{c7,i,M}\sin\varphi_{7,i,M}-$$

$$i_{c3,i+1,M}\sin\varphi_{3,i+1,M})+L_{4,i,M}\Bigg(\sum_{k=1}^{i}\sin\varphi_{4,k,M-1}+$$

$$\sum_{k=1}^{i}\sin\varphi_{5,k,M-1}-\sum_{k=1}^{i}\sin\varphi_{i,k,M}-\sum_{k=1}^{i}\sin\varphi_{2,k,M}\Bigg)$$

$$(L_{3a,i,M}+L_{3b,i,M})\dot{\phi}_{3,i,M}=\dot{\varphi}_{2,i,M}-\dot{\varphi}_{1,i,M}-\dot{\varphi}_{3,i,M}-(L_{3a,i,M}+L_{3b,i,M})i_{c3,i,M}\sin\phi_{3,i,M} \quad \text{Equation (31)}$$

$$L_{5a,i,M}(\dot{\varphi}_{4,i,M}+\dot{\varphi}_{6,i,M}-\dot{\varphi}_{8,i-1,M})- \quad \text{Equation (32)}$$

$$L_{5b,i,M}(\dot{\varphi}_{8,i,M}+\dot{\varphi}_{5,i,M}-\dot{\varphi}_{6,i,M})-$$

$$L_{1,i,M}\Bigg(\sum_{k=1}^{i}\dot{\varphi}_{1,k,M}+\sum_{k=1}^{i-1}\dot{\varphi}_{2,k,M}-\dot{\varphi}_{3,i,M}-$$

$$\sum_{k=1}^{i}\dot{\varphi}_{4,k,M}-\sum_{k=1}^{i-1}\dot{\varphi}_{5,k,M}-\dot{\varphi}_{6,i,M}\Bigg)=$$

$$\varphi_{5,i,M}-\varphi_{4,i,M}+2\pi x_e a_{2,i,M}-L_{2a,i,M}(\sin\varphi_{4,i,M}+$$

$$i_{c6,i,M}\sin\varphi_{6,i,M}-i_{c8,i-1,M}\sin\varphi_{8,i-1,M})+$$

$$L_{5b,i,M}(\sin\varphi_{5,i,M}+i_{c8,i,M}\sin\varphi_{8,i,M}-i_{c6,i,M}\sin\varphi_{6,i,M})+$$

$$L_{1,i,M}\Bigg(\sum_{k=1}^{i}\sin\varphi_{1,k,M}+\sum_{k=1}^{i-1}\sin\varphi_{2,k,M}-i_{c3,i,M}\sin\varphi_{3,i,M}-$$

$$\sum_{k=1}^{i}\sin\varphi_{4,k,M}-\sum_{k=1}^{i-1}\sin\varphi_{5,k,M}-i_{c6,i,M}\sin\varphi_{6,i,M}\Bigg)$$

$$L_{5b,i,M}(\dot{\varphi}_{5,i,M}+\dot{\varphi}_{8,i,M}-\dot{\varphi}_{6,i,M})- \quad \text{Equation (33)}$$

$$L_{5a,i+1,M}(\dot{\varphi}_{4,i+1,M}+\dot{\varphi}_{6,i+1,M}-\dot{\varphi}_{8,i,M})+$$

$$L_{4,i,M+1}\Bigg(\sum_{k=1}^{i}\dot{\varphi}_{4,k,M}+\sum_{k=1}^{i}\dot{\varphi}_{5,k,M}\Bigg)=$$

$$i\times i_b L_{4,i,M+1}+\varphi_{4,i+1,M}-\varphi_{5,i,M}+2\pi x_e a_{4,i,M}-$$

$$L_{5b,i,M}(\sin\varphi_{5,i,M}+i_{c8,i,M}\sin\varphi_{8,i,M}-i_{c6,i,M}\sin\varphi_{6,i,M})+$$

$$L_{5a,i+1,M}($$

$$\sin\varphi_{4,i+1,M}+i_{c6,i+1,M}\sin\varphi_{6,i+1,M}-i_{c8,i,M}\sin\varphi_{8,i,M})-$$

$$L_{4,i,M+1}\Bigg(\sum_{k=1}^{i}\sin\varphi_{4,k,M}+\sum_{k=1}^{i}\sin\varphi_{5,k,M}\Bigg)$$

$(L_{6a,i,M}+L_{6b,i,M})\dot{\phi}_{6,i,M}=\dot{\phi}_{4,i,M}-\dot{\phi}_{5,i,M}-\dot{\phi}_{6,i,M}-(L_{6a,i,M}+L_{6b,i,M})i_{c3,i,M}\sin\phi_{3,i,M}$ Equation (34)

$(L_{7a,i,M}+L_{7b,i,M})\dot{\phi}_{7,i,M}+L_{2a,i+1,M}(\dot{\phi}_{1,i+1,M}+\dot{\phi}_{7,i,M}-\dot{\phi}_{3,i+1,M})-L_{2b,i,M}(\dot{\phi}_{2,i,M}+\dot{\phi}_{3,i,M}-\dot{\phi}_{7,i,M})=-\phi_{7,i,M}-(L_{7a,i,M}+L_{7b,i,M})i_{c7,i,M}\sin\phi_{7,i,M}-L_{2a,i+1,M}(\sin\phi_{1,i+1,M}+i_{c7,i,M}\sin\phi_{7,i,M}-i_{c3,i+1,M}\sin\phi_{3,i+1,M})+L_{2b,i,M}(\sin\phi_{2,i,M}+i_{c3,i,M}\sin\phi_{3,i,M}-i_{c7,i,M}\sin\phi_{7,i,M})$ Equation (35)

$(L_{8a,i,M}+L_{8b,i,M})\dot{\phi}_{8,i,M}+L_{5b,i,M}(\dot{\phi}_{5,i,M}+\dot{\phi}_{8,i,M}-\dot{\phi}_{6,i,M})-L_{5a,i+1,M}(\dot{\phi}_{4,i+1,M}+\dot{\phi}_{6,i+1,M}-\dot{\phi}_{8,i,M})=-\phi_{8,i,M}-(L_{8a,i,M}+L_{8b,i,M})i_{c8,i,M}\sin\phi_{7,i,M}-L_{5b,i,M}(\sin\phi_{5,i,M}+i_{c8,i,M}\sin\phi_{8,i,M}-i_{c6,i,M}\sin\phi_{6,i,M})+L_{5a,i+1,M}(\sin\phi_{4,i+1,M}+i_{c6,i+1,M}\sin\phi_{6,i+1,M}-i_{c8,i,M}\sin\phi_{8,i,M})$ Equation (36)

For the cells 40 on the left side cells of 2D SQIF array 70, i.e. for cells $40_{j,i}$, for j=2, ..., M-1 and i=1 (8 equations):

$L_{2a,1,j}(\dot{\phi}_{1,1,j}-\dot{\phi}_{3,1,j})-L_{2b,1,j}(\dot{\phi}_{2,1,j}+\dot{\phi}_{3,1,j}-\dot{\phi}_{7,1,j})+L_{1,1,j}(\dot{\phi}_{1,1,j}-\dot{\phi}_{3,1,j}-\dot{\phi}_{4,1,j}-\dot{\phi}_{6,1,j})=\phi_{2,1,j}-\phi_{1,1,j}+2\pi x_e a_{1,1,j}-L_{2a,1,j}(\sin\phi_{1,1,j}-i_{c3,1,j}\sin\phi_{3,1,j})+L_{2b,1,j}(\sin\phi_{2,1,j}+i_{c3,1,j}\sin\phi_{3,1,j}-i_{c7,1,j}\sin\phi_{7,1,j})-L_{1,1,j}(\sin\phi_{1,1,j}-i_{c3,1,j}\sin\phi_{3,1,j}-\sin\phi_{4,1,j}-i_{c6,1,j}\sin\phi_{6,1,j})$ Equation (37)

$L_{2b,1,j}(\dot{\phi}_{2,1,j}+\dot{\phi}_{3,1,j}-\dot{\phi}_{7,1,j})-L_{2a,2,j}(\dot{\phi}_{1,2,j}+\dot{\phi}_{7,1,j}-\dot{\phi}_{3,2,j})-L_{4,1,j}(\dot{\phi}_{4,1,j}+\dot{\phi}_{5,1,j-1}-\dot{\phi}_{1,1,j}-\dot{\phi}_{2,1,j})=\phi_{1,2,j}-\phi_{2,1,j}+2\pi x_e a_{3,1,j}-L_{2b,1,j}(\sin\phi_{2,1,j}+i_{c3,1,j}\sin\phi_{3,1,j}-i_{c7,1,j}\sin\phi_{7,1,j})+L_{2a,2,j}(\sin\phi_{1,2,j}+i_{c7,1,j}\sin\phi_{7,1,j}-i_{c3,2,j}\sin\phi_{3,2,j})+L_{4,1,j}(\sin\phi_{4,1,j-1}+\sin\phi_{5,1,j-1}-\sin\phi_{1,1,j}-\sin\phi_{2,1,j})$ Equation (38)

$(L_{3a,1,j}+L_{3b,1,j})\dot{\phi}_{3,1,j}=\dot{\phi}_{2,1,j}-\dot{\phi}_{1,1,j}-\dot{\phi}_{3,1,j}-(L_{3a,1,j}+L_{3b,1,j})i_{c3,1,j}\sin\phi_{3,1,j}$ Equation (39)

$L_{5a,1,j}(\dot{\phi}_{4,1,j}+\dot{\phi}_{6,1,j})-L_{5b,1,j}(\dot{\phi}_{8,1,j}+\dot{\phi}_{5,1,j}-\dot{\phi}_{6,1,j})-L_{1,1,j}(\dot{\phi}_{1,1,j}-\dot{\phi}_{3,1,j}-\dot{\phi}_{4,1,j}-\dot{\phi}_{6,1,j})=\phi_{5,1,j}-\phi_{4,1,j}+2\pi x_e a_{2,1,j}-L_{2a,1,j}(\sin\phi_{4,1,j}+i_{c6,1,j}\sin\phi_{6,1,j})+L_{5b,1,j}(\sin\phi_{5,1,j}+i_{c8,1,j}\sin\phi_{8,1,j}-i_{c6,1,j}\sin\phi_{6,1,j})+L_{1,1,j}(\sin\phi_{1,1,j}-i_{c3,1,j}\sin\phi_{3,1,j}+\sin\phi_{3,1,j}-\sin\phi_{4,1,j}-i_{c6,1,j}\sin\phi_{6,1,j})$ Equation (40)

$L_{5b,1,j}(\dot{\phi}_{5,1,j}+\dot{\phi}_{8,1,j}-\dot{\phi}_{6,1,j})-L_{5a,2,j}(\dot{\phi}_{4,2,j}+\dot{\phi}_{6,2,j}-\dot{\phi}_{8,1,j})+L_{4,1,j+1}(\dot{\phi}_{4,1,j}+\dot{\phi}_{5,1,j}-\dot{\phi}_{1,1,j+1}-\dot{\phi}_{2,1,j+1})=\phi_{4,2,j}-\phi_{5,1,j}+2\pi x_e a_{4,1,j}-L_{5b,1,j}(\sin\phi_{5,1,j}+i_{c8,1,j}\sin\phi_{8,1,j}-i_{c6,1,j}\sin\phi_{6,1,j})+L_{5a,2,j}(\sin\phi_{4,2,j}+i_{c6,2,j}\sin\phi_{6,2,j}-i_{c8,1,j}\sin\phi_{8,1,j})-L_{4,1,j+1}(\sin\phi_{4,1,j}+\sin\phi_{5,1,j}-\sin\phi_{1,1,j+1}-\sin\phi_{2,1,j+1})$ Equation (41)

$(L_{6a,1,j}+L_{6b,1,j})\dot{\phi}_{6,1,j}=\dot{\phi}_{4,1,j}-\dot{\phi}_{5,1,j}-\dot{\phi}_{6,1,j}-(L_{6a,1,j}+L_{6b,1,j})i_{c3,1,j}\sin\phi_{3,1,j}$ Equation (42)

$(L_{7a,1,j}+L_{7b,1,j})\dot{\phi}_{7,1,j}+L_{2a,2,j}(\dot{\phi}_{1,2,j}+\dot{\phi}_{7,1,j}-\dot{\phi}_{3,2,j})-L_{2b,1,j}(\dot{\phi}_{2,1,j}+\dot{\phi}_{3,1,j}-\dot{\phi}_{7,1,j})=-\phi_{7,1,j}-(L_{7a,1,j}+L_{7b,1,j})i_{c7,1,j}\sin\phi_{7,1,j}-L_{2a,2,j}(\sin\phi_{1,2,j}+i_{c7,1,j}\sin\phi_{7,1,j}-i_{c3,2,j}\sin\phi_{3,2,j})+L_{2b,1,j}(\sin\phi_{2,1,j}+i_{c3,1,j}\sin\phi_{3,1,j}-i_{c7,1,j}\sin\phi_{7,1,j})$ Equation (43)

$(L_{8a,1,j}+L_{8b,1,j})\dot{\phi}_{8,1,j}+L_{5b,1,j}(\dot{\phi}_{5,1,j}+\dot{\phi}_{8,1,j}-\dot{\phi}_{6,1,j})-L_{5a,2,j}(\dot{\phi}_{4,2,j}+\dot{\phi}_{6,2,j}-\dot{\phi}_{8,1,j})=-\phi_{8,1,j}-(L_{8a,1,j}+L_{8b,1,j})i_{c8,1,j}\sin\phi_{7,1,j}-L_{5b,1,j}(\sin\phi_{5,1,j}+i_{c8,1,j}\sin\phi_{8,1,j}-i_{c6,1,j}\sin\phi_{6,1,j})+L_{5a,2,j}(\sin\phi_{4,2,j}+i_{c6,2,j}\sin\phi_{6,2,j}-i_{c8,1,j}\sin\phi_{8,1,j})$ Equation (44)

To model the boundary conditions at the corners of the 2D SQIF array 70, and startin with top left-hand corner cell 40$_{j,i}$ for j=1 and i=1 (8 equations):

$$L_{2a,1,1}(\dot\phi_{1,1,1}-\dot\phi_{3,1,1})-L_{2b,1,1}(\dot\phi_{2,1,1}+\dot\phi_{3,1,1}-\dot\phi_{7,1,1})+L_{1,1,1}(\dot\phi_{1,1,1}-\dot\phi_{3,1,1}-\dot\phi_{4,1,1}-\dot\phi_{6,1,1})=\phi_{2,1,1}-\phi_{1,1,1}+2\pi x_e a_{1,1,1}-L_{2a,1,1}(\sin\phi_{1,1,1}-i_{c3,1,1}\sin\phi_{3,1,1})+L_{2b,1,1}(\sin\phi_{2,1,1}+i_{c3,1,1}\sin\phi_{3,1,1}-i_{c7,1,1}\sin\phi_{7,1,1})-L_{1,1,1}(\sin\phi_{1,1,1}-i_{c3,1,1}\sin\phi_{3,1,1}-\sin\phi_{4,1,1}-i_{c6,1,1}\sin\phi_{6,1,1})$$

Equation (45)

$$L_{2b,1,1}(\dot\phi_{2,1,1}+\dot\phi_{3,1,1}-\dot\phi_{7,1,1})-L_{2a,1,1}(\dot\phi_{1,2,1}+\dot\phi_{7,1,1}-\dot\phi_{3,2,1})+L_{4,1,1}(\dot\phi_{1,1,1}+\dot\phi_{2,1,1})=L_{4,1,1}\dot i_b+\phi_{1,2,1}-\phi_{2,1,1}+2\pi x_e a_{3,1,1}-L_{2b,1,1}(\sin\phi_{2,1,1}+i_{c3,1,1}\sin\phi_{3,1,1}-i_{c7,1,1}\sin\phi_{7,1,1})+L_{2a,2,1}(\sin\phi_{1,2,1}+i_{c7,1,1}\sin\phi_{7,1,1}-i_{c3,2,1}\sin\phi_{3,2,1})-L_{4,1,1}(\sin\phi_{1,1,1}+\sin\phi_{2,1,1})$$

Equation (46)

$$(L_{3a,1,1}+L_{3b,1,1})\dot\phi_{3,1,1}=\phi_{2,1,1}-\phi_{1,1,1}-\phi_{3,1,1}-(L_{3a,1,1}+L_{3b,1,1})i_{c3,1,1}\sin\phi_{3,1,1}$$

Equation (47)

$$L_{5a,1,1}(\dot\phi_{4,1,1}+\dot\phi_{6,1,1})-L_{5b,1,1}(\dot\phi_{8,1,1}+\dot\phi_{5,1,1}-\dot\phi_{6,1,1})-L_{1,1,1}(\dot\phi_{1,1,1}-\dot\phi_{3,1,1}-\dot\phi_{4,1,1}-\dot\phi_{6,1,1})=\phi_{5,1,1}-\phi_{4,1,1}+2\pi x_e a_{2,1,1}-L_{2a,1,1}(\sin\phi_{4,1,1}+i_{c6,1,1}\sin\phi_{6,1,1})+L_{5b,1,1}(\sin\phi_{5,1,1}+i_{c8,1,1}\sin\phi_{8,1,1}-i_{c6,1,1}\sin\phi_{6,1,1})+L_{1,1,1}(\sin\phi_{1,1,1}-i_{c3,1,1}\sin\phi_{3,1,1}-\sin\phi_{4,1,1}-i_{c6,1,1}\sin\phi_{6,1,1})$$

Equation (48)

$$L_{5b,1,1}(\dot\phi_{5,1,1}+\dot\phi_{8,1,1}-\dot\phi_{6,1,1})-L_{5a,2,1}(\dot\phi_{4,2,1}+\dot\phi_{6,2,1}-\dot\phi_{8,1,1})+L_{4,1,2}(\dot\phi_{4,1,1}+\dot\phi_{5,1,1}-\dot\phi_{1,1,2}-\dot\phi_{2,1,2})=\phi_{4,2,1}-\phi_{5,1,1}+2\pi x_e a_{4,1,1}-L_{5b,1,1}(\sin\phi_{5,1,1}+i_{c8,1,1}\sin\phi_{8,1,1}-i_{c6,1,1}\sin\phi_{6,1,1})+L_{5a,2,1}(\sin\phi_{4,2,1}+i_{c6,2,1}\sin\phi_{6,2,1}-i_{c8,1,1}\sin\phi_{8,1,1})-L_{4,1,2}(\sin\phi_{4,1,1}+\sin\phi_{5,1,1}-\sin\phi_{1,1,2}-\sin\phi_{2,1,2})$$

Equation (49)

$$(L_{6a,1,1}+L_{6b,1,1})\dot\phi_{6,1,1}=\phi_{4,1,1}-\phi_{5,1,1}-\phi_{6,1,1}-(L_{6a,1,1}+L_{6b,1,1})i_{c3,1,1}\sin\phi_{3,1,1}$$

Equation (50)

$$(L_{7a,1,1}+L_{7b,1,1})\dot\phi_{7,1,1}+L_{2a,2,1}(\dot\phi_{1,2,1}+\dot\phi_{7,1,1}-\dot\phi_{3,2,1})-L_{2b,1,1}(\dot\phi_{2,1,1}+\dot\phi_{3,1,1}-\dot\phi_{7,1,1})=-\phi_{7,1,1}-(L_{7a,1,1}+L_{7b,1,1})i_{c7,1,1}\sin\phi_{7,1,1}-L_{2a,2,1}(\sin\phi_{1,2,1}+i_{c7,1,1}\sin\phi_{7,1,1}-i_{c3,2,1}\sin\phi_{3,2,1})+L_{2b,1,1}(\sin\phi_{2,1,1}+i_{c3,1,1}\sin\phi_{3,1,1}-i_{c7,1,1}\sin\phi_{7,1,1})$$

Equation (51)

$$(L_{8a,1,1}+L_{8b,1,1})\dot\phi_{8,1,1}+L_{5b,1,1}(\dot\phi_{5,1,1}+\dot\phi_{8,1,1}-\dot\phi_{6,1,1})-L_{5a,2,1}(\dot\phi_{4,2,1}+\dot\phi_{6,2,1}-\dot\phi_{8,1,1})=-\phi_{8,1,1}-(L_{8a,1,1}+L_{8b,1,1})i_{c8,1,1}\sin\phi_{7,1,1}-L_{5b,1,1}(\sin\phi_{5,1,1}+i_{c8,1,1}\sin\phi_{8,1,1}-i_{c6,1,1}\sin\phi_{6,1,1})+L_{5a,2,1}(\sin\phi_{4,2,1}+i_{c6,2,1}\sin\phi_{6,2,1}-i_{c8,1,1}\sin\phi_{8,1,1})$$

Equation (52)

For the bottom left-hand corner cell 40$_{j,i}$ for j=M and i=1:

$$L_{2a,1,M}(\dot\phi_{1,1,M}-\dot\phi_{3,1,M})-L_{2b,1,M}(\dot\phi_{2,1,M}+\dot\phi_{3,1,M}-\dot\phi_{7,1,M})+L_{1,1,M}(\dot\phi_{1,1,M}-\dot\phi_{3,1,M}-\dot\phi_{4,1,M}-\dot\phi_{6,1,M})=\phi_{2,1,M}-\phi_{1,1,M}+2\pi x_e a_{1,1,M}-L_{2a,1,M}(\sin\phi_{1,1,M}-i_{c3,1,M}\sin\phi_{3,1,M})+L_{2b,1,M}(\sin\phi_{2,1,M}+i_{c3,1,M}\sin\phi_{3,1,M}-i_{c7,1,M}\sin\phi_{7,1,M})-L_{1,1,M}(\sin\phi_{1,1,M}-i_{c3,1,M}\sin\phi_{3,1,M}-\sin\phi_{4,1,M}-i_{c6,1,M}\sin\phi_{6,1,M})$$

Equation (53)

$$L_{2b,1,M}(\dot\phi_{2,1,M}+\dot\phi_{3,1,M}-\dot\phi_{7,1,M})-L_{2a,2,M}(\dot\phi_{1,2,M}+\dot\phi_{7,1,M}-\dot\phi_{3,2,M})-L_{4,1,M+1}(\dot\phi_{4,1,M-1}+\dot\phi_{5,1,M-1}-\dot\phi_{1,1,M}-\dot\phi_{2,1,M})=\phi_{1,2,M}-\phi_{2,1,M}+2\pi x_e a_{3,1,M}-L_{2b,1,M}(\sin\phi_{2,1,M}+i_{c3,1,M}\sin\phi_{3,1,M}-i_{c7,1,M}\sin\phi_{7,1,M})+L_{2a,2,M}(\sin\phi_{1,2,M}+i_{c7,1,M}\sin\phi_{7,1,M}-i_{c3,2,M}\sin\phi_{3,2,M})+L_{4,1,M}(\sin\phi_{4,1,M-1}+\sin\phi_{5,1,M-1}-\sin\phi_{1,1,M}-\sin\phi_{2,1,M})$$

Equation (54)

$$(L_{3a,1,M}+L_{3b,1,M})\dot\phi_{3,1,M}=\phi_{2,1,M}-\phi_{1,1,M}-\phi_{3,1,M}-(L_{3a,1,M}+L_{3b,1,M})i_{c3,1,M}\sin\phi_{3,1,M}$$

Equation (55)

$$L_{5a,1,M}(\dot\phi_{4,1,M}+\dot\phi_{6,1,M})-L_{5b,1,M}(\dot\phi_{8,1,M}+\dot\phi_{5,1,M}-\dot\phi_{6,1,M})-L_{1,1,M}(\dot\phi_{1,1,M}-\dot\phi_{3,1,M}-\dot\phi_{4,1,M}-\dot\phi_{6,1,M})=\phi_{5,1,M}-\phi_{4,1,M}+2\pi x_e a_{2,1,M}-L_{2a,1,M}(\sin\phi_{4,1,M}+i_{c6,1,M}\sin\phi_{8,1,M})+L_{5b,1,M}(\sin\phi_{5,1,M}+i_{c8,1,M}\sin\phi_{8,1,M}-i_{c6,1,M}\sin\phi_{6,1,M})+L_{1,1,M}(\sin\phi_{1,1,M}-i_{c3,1,M}\sin\phi_{3,1,M}-\sin\phi_{4,1,M}-i_{c6,1,M}\sin\phi_{6,1,M})$$

Equation (56)

$$L_{5b,1,M}(\dot\phi_{5,1,M}+\dot\phi_{8,1,M}-\dot\phi_{6,1,M})-L_{5a,2,M}(\dot\phi_{4,2,M}+\dot\phi_{6,2,M}-\dot\phi_{8,1,M})+L_{4,1,M+1}(\dot\phi_{4,1,M}+\dot\phi_{5,1,M})=\phi_{4,2,M}-\phi_{5,1,M}+2\pi x_e a_{4,1,M}-L_{5b,1,M}(\sin\phi_{5,1,M}+i_{c8,1,M}\sin\phi_{8,1,M}-i_{c6,1,M}\sin\phi_{6,1,M})+L_{5a,2,M}(\sin\phi_{4,2,M}+i_{c6,2,M}\sin\phi_{6,2,M}-i_{c8,1,M}\sin\phi_{8,1,M})-L_{4,1,M+1}(\sin\phi_{4,1,M}+\sin\phi_{5,1,M})$$

Equation (57)

$$(L_{6a,1,M}+L_{6b,1,M})\dot\phi_{6,1,M}=\phi_{4,1,M}-\phi_{5,1,M}-\phi_{6,1,M}-(L_{6a,1,M}+L_{6b,1,M})i_{c3,1,M}\sin\phi_{3,1,M}$$

Equation (58)

$$(L_{7a,1,M}+L_{7b,1,M})\dot\phi_{7,1,M}+L_{2a,2,M}(\dot\phi_{1,2,M}+\dot\phi_{7,1,M}-\dot\phi_{3,2,M})-L_{2b,1,M}(\dot\phi_{2,1,M}+\dot\phi_{3,1,M}-\dot\phi_{7,1,M})=-\phi_{7,1,M}-(L_{7a,1,M}+L_{7b,1,M})i_{c7,1,M}\sin\phi_{7,1,M}-L_{2a,2,M}(\sin\phi_{1,2,M}+i_{c7,1,M}\sin\phi_{7,1,M}-i_{c3,2,M}\sin\phi_{3,2,M})+L_{2b,1,M}(\sin\phi_{2,1,M}+i_{c3,1,M}\sin\phi_{3,1,M}-i_{c7,1,M}\sin\phi_{7,1,M})$$

Equation (59)

$$(L_{8a,1,M}+L_{8b,1,M})\dot\phi_{8,1,M}+L_{5b,1,M}(\dot\phi_{5,1,M}+\dot\phi_{8,1,M}-\dot\phi_{6,1,M})-L_{5a,2,M}(\dot\phi_{4,2,M}+\dot\phi_{6,2,M}-\dot\phi_{8,1,M})=-\phi_{8,1,M}-(L_{8a,1,M}+L_{8b,1,M})i_{c8,1,M}\sin\phi_{7,1,M}-L_{5b,1,M}(\sin\phi_{5,1,M}+i_{c8,1,M}\sin\phi_{8,1,M}-i_{c6,1,M}\sin\phi_{6,1,M})+L_{5a,2,M}(\sin\phi_{4,2,M}+i_{c6,2,M}\sin\phi_{6,2,M}-i_{c8,1,M}\sin\phi_{8,1,M})$$

Equation (60)

For the right side cells of 2D SQIF array 70, i.e. for cells 40$_{j,i}$ for j=2, . . . , M-1 and i=N (6 equations):

$$L_{2a,N,j}\dot\varphi_{1,N,j} - (L_{1,N,j} + L_{2b,N,j})$$

Equation (61)

$$\left(\sum_{k=1}^{N}\varphi_{4,k,j-1} + \sum_{k=1}^{N}\varphi_{5,k,j-1} - \sum_{k=1}^{N}\dot\varphi_{1,k,j} - \sum_{k=1}^{N-1}\dot\varphi_{2,k,j}\right) -$$

$$(L_{1,N,j} + L_{2a,N,j} + L_{2b,N,j})\dot\varphi_{3,N,j} + L_{1,N,j}\dot\varphi_{5,N,j} -$$

$$L_{1,N,j}\dot\varphi_{6,N,j} + L_{2a,N,j}\dot\varphi_{7,N-1,j} =$$

$$\varphi_{2,N,j} - \varphi_{1,N,j} + 2\pi x_e a_{1,N,j} - L_{2a,N,j}\sin\varphi_{1,N,j} +$$

$$(L_{1,N,j} + L_{2b,N,j})\left(\sum_{k=1}^{N}\sin\varphi_{4,k,j-1} + \sum_{k=1}^{N}\sin\varphi_{5,k,j-1} - \sum_{k=1}^{N}\sin\varphi_{1,k,j} - \sum_{k=1}^{N-1}\sin\varphi_{2,k,j}\right) +$$

$$(L_{1,N,j} + L_{2a,N,j} + L_{2b,N,j})i_{c3,N,j}\sin\varphi_{3,N,j} -$$

$$L_{1,N,j}\sin\varphi_{5,N,j} + L_{1,N,j}i_{c6,N,j}\sin\varphi_{6,N,j} -$$

$$L_{2a,N,j}i_{c7,N-1,j}\sin\varphi_{7,N-1,j}$$

$$L_{2a,N,j}\left(\sum_{k=1}^{N}\varphi_{4,k,j-1} + \sum_{k=1}^{N}\dot\varphi_{5,k,j-1} - \sum_{k=1}^{N-1}\dot\varphi_{1,k,j} - \sum_{k=1}^{N}\dot\varphi_{2,k,j}\right) -$$

Equation (62)

$$(L_{1,N,j} + L_{2b,N,j})\dot\varphi_{2,N,j} -$$

$$(L_{1,N,j} + L_{2a,N,j} + L_{2b,N,j})\dot\varphi_{3,N,j} +$$

$$L_{1,N,j}\dot\varphi_{5,N,j} - L_{1,N,j}\dot\varphi_{6,N,j} + L_{2a,N,j}\dot\varphi_{7,N-1,j} =$$

$$\varphi_{2,N,j} - \varphi_{1,N,j} + 2\pi x_e a_{1,N,j} -$$

$$L_{2a,N,j}\left(\sum_{k=1}^{N}\sin\varphi_{4,k,j-1} + \sum_{k=1}^{N}\sin\varphi_{5,k,j-1} - \sum_{k=1}^{N-1}\sin\varphi_{1,k,j} - \sum_{k=1}^{N}\sin\varphi_{2,k,j}\right) + (L_{1,N,j} + L_{2b,N,j})\sin\varphi_{2,N,j} +$$

$$(L_{1,N,j} + L_{2a,N,j} + L_{2b,N,j})i_{c3,N,j}\sin\varphi_{3,N,j} -$$

$$L_{1,N,j}\sin\varphi_{5,N,j} + L_{1,N,j}i_{c6,N,j}\sin\varphi_{6,N,j} -$$

$$L_{2a,N,j}i_{c7,N-1,j}\sin\varphi_{7,N-1,j}$$

$$(L_{3a,N,j}+L_{3b,N,j})\dot\phi_{3,N,j}=\phi_{2,N,j}-\phi_{1,N,j}-\phi_{3,N,j}-(L_{3a,N,j}+L_{3b,N,j})i_{c3,N,j}\sin\phi_{3,N,j}$$

Equation (63)

$$L_{5a,N,j}\dot{\varphi}_{4,N,j} - (L_{1,N,j} + L_{5b,N,j})$$ Equation (64)

$$\left(\sum_{k=1}^{N}\dot{\varphi}_{1,k,j} + \sum_{k=1}^{N}\dot{\varphi}_{2,k,j} - \sum_{k=1}^{N}\dot{\varphi}_{4,k,j} - \sum_{k=1}^{N-1}\dot{\varphi}_{5,k,j}\right) +$$

$$(L_{1,N,j} + L_{5a,N,j} + L_{5b,N,j})\dot{\varphi}_{6,N,j} + L_{1,N,j}\dot{\varphi}_{2,N,j} +$$

$$L_{1,N,j}\dot{\varphi}_{3,N,j} - L_{5a,N,j}\dot{\varphi}_{8,N-1,j} =$$

$$\varphi_{5,N,j} - \varphi_{4,N,j} + 2\pi x_e a_{2,N,j} - L_{5a,N,j}\sin\varphi_{4,N,j} +$$

$$(L_{1,N,j} + L_{5b,N,j})\left(\sum_{k=1}^{N}\sin\varphi_{1,k,j} + \right.$$

$$\left.\sum_{k=1}^{N}\sin\varphi_{2,k,j} - \sum_{k=1}^{N}\sin\varphi_{4,k,j} - \sum_{k=1}^{N-1}\sin\varphi_{5,k,j}\right) -$$

$$(L_{1,N,j} + L_{5a,N,j} + L_{5b,N,j})i_{c6,N,j}\sin\varphi_{6,N,j} -$$

$$L_{1,N,j}\sin\varphi_{2,N,j} - L_{1,N,j}i_{c3,N,j}\sin\varphi_{3,N,j} +$$

$$L_{5a,N,j}i_{c8,N-1,j}\sin\varphi_{8,N-1,j}$$

$$L_{5a,N,j}\left(\sum_{k=1}^{N}\dot{\varphi}_{1,k,j} + \sum_{k=1}^{N}\dot{\varphi}_{2,k,j} - \sum_{k=1}^{N}\dot{\varphi}_{4,k,j} - \sum_{k=1}^{N}\dot{\varphi}_{5,k,j}\right) -$$ Equation (65)

$$(L_{1,N,j} + L_{5b,N,j})\dot{\varphi}_{5,N,j} +$$

$$(L_{1,N,j} + L_{5a,N,j} + L_{5b,N,j})\dot{\varphi}_{6,N,j} +$$

$$L_{1,N,j}\dot{\varphi}_{2,N,j} + L_{1,N,j}\dot{\varphi}_{3,N,j} - L_{5a,N,j}\dot{\varphi}_{8,N-1,j} =$$

$$\varphi_{5,N,j} - \varphi_{4,N,j} + 2\pi x_e a_{2,N,j} -$$

$$L_{5a,N,j}\left(\sum_{k=1}^{N}\sin\varphi_{1,k,j} + \sum_{k=1}^{N}\sin\varphi_{2,k,j} - \sum_{k=1}^{N-1}\sin\varphi_{4,k,j} - \right.$$

$$\left.\sum_{k=1}^{N}\sin\varphi_{5,k,j}\right) + (L_{1,N,j} + L_{5b,N,j})\sin\varphi_{5,N,j} -$$

$$(L_{1,N,j} + L_{5a,N,j} + L_{5b,N,j})i_{c6,N,j}\sin\varphi_{6,N,j} -$$

$$L_{1,N,j}\sin\varphi_{2,N,j} - L_{1,N,j}i_{c3,N,j}\sin\varphi_{3,N,j} +$$

$$L_{5a,N,j}i_{c8,N-1,j}\sin\varphi_{8,N-1,j}$$

$$(L_{6a,N,j}+L_{6b,N,j})\dot{\phi}_{6,N,j}=\phi_{4,N,j}-\phi_{5,N,j}-\phi_{6,N,j}-(L_{6a,N,j}+L_{6b,N,j})i_{c3,N,j}\sin\phi_{3,N,j}$$ Equation (66)

To model the top right-hand corner cell 40 of array 70, cell 40$_{j,i}$ for j=1 and i=N (6 equations):

$$L_{2a,N,1}\dot{\varphi}_{1,N,1} + (L_{1,N,1} + L_{2b,N,1})\left(\sum_{k=1}^{N}\dot{\varphi}_{1,k,1} + \sum_{k=1}^{N-1}\dot{\varphi}_{2,k,1}\right) -$$ Equation (67)

$$(L_{1,N,1} + L_{2a,N,1} + L_{2b,N,1})\dot{\varphi}_{3,N,1} +$$

$$L_{1,N,1}\dot{\varphi}_{5,N,1} - L_{1,N,1}\dot{\varphi}_{6,N,1} + L_{2a,N,1}\dot{\varphi}_{7,N-1,1} =$$

$$N \times (L_{1,N,1} + L_{2b,N,1})i_b + \varphi_{2,N,1} - \varphi_{1,N,1} +$$

$$2\pi x_e a_{1,N,1} - L_{2a,N,1}\sin\varphi_{1,N,1} - (L_{1,N,1} + L_{2b,N,1})$$

$$\left(\sum_{k=1}^{N}\sin\varphi_{1,k,1} + \sum_{k=1}^{N-1}\sin\varphi_{2,k,1}\right) - L_{1,N,1}\sin\varphi_{5,N,1} +$$

$$(L_{1,N,1} + L_{2a,N,1} + L_{2b,N,1})i_{c3,N,1}\sin\varphi_{3,N,1} +$$

$$L_{1,N,1}i_{c6,N,1}\sin\varphi_{6,N,1} - L_{2a,N,1}i_{c7,N-1,1}\sin\varphi_{7,N-1,1}$$

$$-L_{2a,N,1}\left(\sum_{k=1}^{N-1}\dot{\varphi}_{1,k,1}\sum_{k=1}^{N}\dot{\varphi}_{2,k,1}\right) - (L_{1,N,1} + L_{2b,N,1})\dot{\varphi}_{2,N,1} -$$ Equation (68)

$$(L_{1,N,1} + L_{2a,N,1} + L_{2b,N,1})\dot{\varphi}_{3,N,1} +$$

$$L_{1,N,1}\dot{\varphi}_{5,N,1} - L_{1,N,1}\dot{\varphi}_{6,N,1} + L_{2a,N,1}\dot{\varphi}_{7,N-1,1} =$$

$$-N \times L_{2a,N,1}i_b + \varphi_{2,N,1} - \varphi_{1,N,1} + 2\pi x_e a_{1,N,1} +$$

$$L_{2a,N,1}\left(\sum_{k=1}^{N-1}\sin\varphi_{1,k,1} + \sum_{k=1}^{N}\sin\varphi_{2,k,1}\right) +$$

$$(L_{1,N,1} + L_{2b,N,1})\sin\varphi_{2,N,1} - L_{1,N,1}\sin\varphi_{5,N,1} +$$

$$(L_{1,N,1} + L_{2a,N,1} + L_{2b,N,1})i_{c3,N,1}\sin\varphi_{3,N,1} +$$

$$L_{1,N,1}i_{c6,N,1}\sin\varphi_{6,N,1} - L_{2a,N,1}i_{c7,N-1,1}\sin\varphi_{7,N-1,1}$$

$$(L_{3a,N,1}+L_{3b,N,1})\dot{\phi}_{3,N,1}=\phi_{2,N,1}-\phi_{1,N,1}-\phi_{3,N,1}-(L_{3a,N,1}+L_{3b,N,1})i_{c3,N,1}\sin\phi_{3,N,1}$$ Equation (69)

$$L_{5a,N,1}\dot{\varphi}_{4,N,1} - (L_{1,N,1} + L_{5b,N,1})$$ Equation (70)

$$\left(\sum_{k=1}^{N}\dot{\varphi}_{1,k,1} + \sum_{k=1}^{N}\dot{\varphi}_{2,k,1} - \sum_{k=1}^{N}\dot{\varphi}_{4,k,1} - \sum_{k=1}^{N-1}\dot{\varphi}_{5,k,1}\right) +$$

$$(L_{1,N,1} + L_{5a,N,1} + L_{5b,N,1})\dot{\varphi}_{6,N,1} + L_{1,N,1}\dot{\varphi}_{2,N,1} +$$

$$L_{1,N,1}\dot{\varphi}_{3,N,1} - L_{5a,N,1}\dot{\varphi}_{8,N-1,1} =$$

$$\varphi_{5,N,1} - \varphi_{4,N,1} + 2\pi x_e a_{2,N,1} - L_{5a,N,1}\sin\varphi_{4,N,1} +$$

$$(L_{1,N,1} + L_{5b,N,1})\left(\sum_{k=1}^{N}\sin\varphi_{1,k,1} + \right.$$

$$\left.\sum_{k=1}^{N}\sin\varphi_{2,k,1} - \sum_{k=1}^{N}\sin\varphi_{4,k,1} - \sum_{k=1}^{N-1}\sin\varphi_{5,k,1}\right) -$$

$$(L_{1,N,1} + L_{5a,N,1} + L_{5b,N,1})i_{c6,N,1}\sin\varphi_{6,N,1} -$$

$$L_{1,N,1}\sin\varphi_{2,N,1} - L_{1,N,1}i_{c3,N,1}\sin\varphi_{3,N,1} +$$

$$L_{5a,N,1}i_{c8,N-1,1}\sin\varphi_{8,N-1,1}$$

$$L_{5a,N,1}\left(\sum_{k=1}^{N}\dot{\varphi}_{1,k,1} + \sum_{k=1}^{N}\dot{\varphi}_{2,k,1} - \sum_{k=1}^{N-1}\dot{\varphi}_{4,k,1} - \sum_{k=1}^{N}\dot{\varphi}_{5,k,1}\right) -$$ Equation (71)

$$(L_{1,N,1} + L_{5b,N,1})\dot{\varphi}_{5,N,1} +$$

$$(L_{1,N,1} + L_{5a,N,1} + L_{5b,N,1})\dot{\varphi}_{6,N,1} +$$

$$L_{1,N,1}\dot{\varphi}_{2,N,1} + L_{1,N,1}\dot{\varphi}_{3,N,1} - L_{5a,N,1}\dot{\varphi}_{8,N-1,1} =$$

$$\varphi_{5,N,1} - \varphi_{4,N,1} + 2\pi x_e a_{2,N,1} -$$

$$L_{5a,N,1}\left(\sum_{k=1}^{N}\sin\varphi_{1,k,1} + \sum_{k=1}^{N}\sin\varphi_{2,k,1} - \sum_{k=1}^{N-1}\sin\varphi_{4,k,1} - \right.$$

$$\left.\sum_{k=1}^{N}\sin\varphi_{5,k,1}\right) + (L_{1,N,1} + L_{5b,N,1})\sin\varphi_{5,N,1} -$$

$$(L_{1,N,1} + L_{5a,N,1} + L_{5b,N,1})i_{c6,N,1}\sin\varphi_{6,N,1} -$$

$$L_{1,N,1}\sin\varphi_{2,N,1} - L_{1,N,1}i_{c3,N,1}\sin\varphi_{3,N,1} +$$

$$L_{5a,N,1}i_{c8,N-1,1}\sin\varphi_{8,N-1,1}$$

$$(L_{6a,N,1}+L_{6b,N,1})\dot{\phi}_{6,N,1}=\phi_{4,N,1}-\phi_{5,N,1}-\phi_{6,N,1}-(L_{6a,N,1}+L_{6b,N,1})i_{c3,N,1}\sin\phi_{3,N,1}$$ Equation (72)

In similar fashion of the above, in order to model the bottom right-hand corner cell of 2D SQIF array 70, cell 40$_{j,i}$ for j=M and i=N (6 equations):

$$L_{2a,N,M}\dot{\varphi}_{1,N,M} - \qquad \text{Equation (73)}$$

$$(L_{1,N,M}+L_{2b,N,M})\left(\sum_{k=1}^{N}\dot{\varphi}_{4,k,M-1} + \sum_{k=1}^{N}\dot{\varphi}_{5,k,M-1} - \sum_{k=1}^{N}\dot{\varphi}_{1,k,M} - \sum_{k=1}^{N-1}\dot{\varphi}_{2,k,M}\right) -$$

$$(L_{1,N,M}+L_{2a,N,M}+L_{2b,N,M})\dot{\varphi}_{3,N,M}+L_{1,N,M}\dot{\varphi}_{5,N,M}-$$

$$L_{1,N,M}\dot{\varphi}_{6,N,M}+L_{2a,N,M}\dot{\varphi}_{7,N-1,M} =$$

$$\varphi_{2,N,M}-\varphi_{1,N,M}+2\pi x_e a_{1,N,M}+$$

$$(L_{1,N,M}+L_{2b,N,M})\left(\sum_{k=1}^{N}\sin\varphi_{4,k,M-1}+\sum_{k=1}^{N}\sin\varphi_{5,k,M-1}-\right.$$

$$\left.\sum_{k=1}^{N}\sin\varphi_{1,k,M}-\sum_{k=1}^{N-1}\sin\varphi_{2,k,M}\right)-L_{2a,N,M}\sin\varphi_{1,N,M}+$$

$$(L_{1,N,M}+L_{2a,N,M}+L_{2b,N,M})i_{c3,N,M}\sin\varphi_{3,N,M}-$$

$$L_{1,N,M}\sin\varphi_{5,N,M}+L_{1,N,M}i_{c6,N,M}\sin\varphi_{6,N,M}-$$

$$L_{2a,N,M}i_{c7,N-1,M}\sin\varphi_{7,N-1,M}$$

$$L_{2a,N,M}\left(\sum_{k=1}^{N}\dot{\varphi}_{4,k,M-1}+\sum_{k=1}^{N}\dot{\varphi}_{5,k,M-1}-\sum_{k=1}^{N-1}\dot{\varphi}_{1,k,M}-\right. \qquad \text{Equation (74)}$$

$$\left.\sum_{k=1}^{N}\dot{\varphi}_{2,k,M}\right)-(L_{1,N,M}+L_{2b,N,M})\dot{\varphi}_{2,N,M}-$$

$$(L_{1,N,M}+L_{2a,N,M}+L_{2b,N,M})\dot{\varphi}_{3,N,M}+L_{1,N,M}\dot{\varphi}_{5,N,M}-$$

$$L_{1,N,M}\dot{\varphi}_{6,N,M}+L_{2a,N,M}\dot{\varphi}_{7,N-1,M} =$$

$$\varphi_{2,N,M}-\varphi_{1,N,M}+2\pi x_e a_{1,N,M}-L_{2a,N,M}\left(\sum_{k=1}^{N}\sin\varphi_{4,k,M-1}+\right.$$

$$\left.\sum_{k=1}^{N}\sin\varphi_{5,k,M-1}-\sum_{k=1}^{N-1}\sin\varphi_{1,k,M}-\sum_{k=1}^{N}\sin\varphi_{2,k,M}\right)+$$

$$(L_{1,N,M}+L_{2b,N,M})\sin\varphi_{2,N,M}+$$

$$(L_{1,N,M}+L_{2a,N,M}+L_{2b,N,M})i_{c3,N,M}\sin\varphi_{3,N,M}-$$

$$L_{1,N,M}\sin\varphi_{5,N,M}+L_{1,N,M}i_{c6,N,M}\sin\varphi_{6,N,M}-$$

$$L_{2a,N,M}i_{c7,N-1,M}\sin\varphi_{7,N-1,M}$$

$$(L_{3a,N,M}+L_{3b,N,M})\dot{\varphi}_{3,N,M}-\dot{\varphi}_{2,N,M}-\dot{\varphi}_{1,N,M}-\dot{\varphi}_{3,N,M}- \qquad \text{Equation (75)}$$
$$(L_{3a,N,M}+L_{3b,N,M})i_{c3,N,M}\sin\varphi_{3,N,M}$$

$$L_{5a,N,M}\dot{\varphi}_{4,N,M}-(L_{1,N,M}+L_{5b,N,M}) \qquad \text{Equation (76)}$$

$$\left(\sum_{k=1}^{N}\dot{\varphi}_{1,k,M}+\sum_{k=1}^{N}\dot{\varphi}_{2,k,M}-\sum_{k=1}^{N}\dot{\varphi}_{4,k,M}-\sum_{k=1}^{N-1}\dot{\varphi}_{5,k,M}\right)+$$

$$(L_{1,N,M}+L_{5a,N,M}+L_{5b,N,M})\dot{\varphi}_{6,N,M}+$$

$$L_{1,N,M}\dot{\varphi}_{2,N,M}+L_{1,N,M}\dot{\varphi}_{3,N,M}-L_{5a,N,M}\dot{\varphi}_{8,N-1,M}=$$

$$\varphi_{5,N,M}-\varphi_{4,N,M}+2\pi x_e a_{2,N,M}-L_{5a,N,M}\sin\varphi_{4,N,M}+$$

$$(L_{1,N,M}+L_{5b,N,M})\left(\sum_{k=1}^{N}\sin\varphi_{1,k,M}+\right.$$

$$\left.\sum_{k=1}^{N}\sin\varphi_{2,k,M}-\sum_{k=1}^{N}\sin\varphi_{4,k,M}-\sum_{k=1}^{N-1}\sin\varphi_{5,k,M}\right)-$$

$$(L_{1,N,M}+L_{5a,N,M}+L_{5b,N,M})i_{c6,N,M}\sin\varphi_{6,N,M}-$$

$$L_{1,N,M}\sin\varphi_{2,N,M}-L_{1,N,M}i_{c3,N,M}\sin\varphi_{3,N,M}+$$

$$L_{5a,N,M}i_{c8,N-1,M}\sin\varphi_{8,N-1,M}$$

$$L_{5a,N,M}\left(\sum_{k=1}^{N}\dot{\varphi}_{1,k,M}+\sum_{k=1}^{N}\dot{\varphi}_{2,k,M}-\sum_{k=1}^{N-1}\dot{\varphi}_{4,k,M}-\sum_{k=1}^{N}\dot{\varphi}_{5,k,M}\right)- \qquad \text{Equation (77)}$$

$$(L_{1,N,M}+L_{5b,N,M})\dot{\varphi}_{5,N,M}+$$

$$(L_{1,N,M}+L_{5a,N,M}+L_{5b,N,M})\dot{\varphi}_{6,N,M}+$$

$$L_{1,N,M}\dot{\varphi}_{2,N,M}+L_{1,N,M}\dot{\varphi}_{3,N,M}-L_{5a,N,M}\dot{\varphi}_{8,N-1,M}=$$

$$\varphi_{5,N,M}-\varphi_{4,N,M}+2\pi x_e a_{2,N,M}-$$

$$L_{5a,N,M}\left(\sum_{k=1}^{N}\sin\varphi_{1,k,M}+\sum_{k=1}^{N}\sin\varphi_{2,k,M}-\sum_{k=1}^{N-1}\sin\varphi_{4,k,M}-\right.$$

$$\left.\sum_{k=1}^{N}\sin\varphi_{5,k,M}\right)+(L_{1,N,M}+L_{5b,N,M})\sin\varphi_{5,N,M}-$$

$$(L_{1,N,M}+L_{5a,N,M}+L_{5b,N,M})i_{c6,N,M}\sin\varphi_{6,N,M}-$$

$$L_{1,N,M}\sin\varphi_{2,N,M}-L_{1,N,M}i_{c3,N,M}\sin\varphi_{3,N,M}+$$

$$L_{5a,N,M}i_{c8,N-1,M}\sin\varphi_{8,N-1,M}$$

$$(L_{6a,N,M}+L_{6b,N,M})\dot{\varphi}_{6,N,M}-\dot{\varphi}_{4,N,M}-\dot{\varphi}_{5,N,M}-\dot{\varphi}_{6,N,M}- \qquad \text{Equation (78)}$$
$$(L_{6a,N,M}+L_{6b,N,M})i_{c3,N,M}\sin\varphi_{3,N,M}$$

What is claimed is:

1. A two-dimensional Superconducting Quantum Interference Filter (SQIF) array comprising:
   at least three cells arranged in two dimensions;
   each of said cells having at least two bi-Superconducting Quantum Interference Devices (bi-SQUIDs);
   said at least two bi-SQUIDs being merged together so that said bi-SQUIDs share at least two bi-SQUID junctions and at least one inductance, wherein said at least one inductance is varied to maintain an over-all anti-peak response by adjusting a hole size of a ground plane under said inductance.

2. The SQIF array of claim 1 wherein said cells are diamond-shaped or hexagonal-shaped when viewed in top plan.

3. The SQIF array of claim 1 wherein each of said cells has at least four cell junctions, and further wherein each of said cells shares at least three cell junctions with an adjacent cell.

4. The SQIF array of claim 1 wherein each said bi-SQUID has a loop size, wherein said loop sizes are uniform, and wherein said bi-SQUIDs have non-uniform inductances, and further wherein said non-uniform inductances are modeled to maintain said overall anti-peak response for said SQIF array that is linear.

5. A method for establishing a two-dimensional Superconducting Quantum Interference Filter (SQIF) array, comprising the steps of:

A) providing a plurality of bi-Superconducting Quantum Interference Devices (bi-SQUIDs);

B) merging at least two bi-SQUIDs to establish a plurality of array cells; said step B) being accomplished so that said at least two bi-SQUIDs share at least two bi-SQUID junctions and at least one inductance, and so that said step B) establishes at least four cell junctions, wherein said at least one inductance is varied to maintain an overall anti-peak response by adjusting a hole size of a ground plane under said inductance; and, C) connecting said array cells in a two-dimensional manner so that each array cell shares at least three cell junctions with another of said array cells.

6. The method of claim 5, wherein said array cells are diamond shaped or hexagonal shaped when viewed in top plan.

7. The method of claim 5, wherein each said bi-SQUID has a loop size, wherein said loop sizes are uniform, and wherein said step B) is accomplished using bi-SQUIDs having non-uniform inductances, and further comprising the step of:

D) modeling said non-uniform inductances to maintain said overall anti-peak response for said SQIF array that is linear.

8. The method of claim 7, wherein said non-uniform inductances have a distribution $\sigma$ of at least 30 percent.

* * * * *